United States Patent
Spiro et al.

(10) Patent No.: US 10,354,196 B2
(45) Date of Patent: Jul. 16, 2019

(54) MACHINE FAULT MODELLING

(71) Applicant: Palantir Technologies Inc., Palo Alto, CA (US)

(72) Inventors: Ezra Spiro, New York, NY (US); Andre Frederico Cavalheiro Menck, New York, NY (US); Anshuman Prasad, New York, NY (US); Arthur Thouzeau, London (GB); Caroline Henry, London (GB); Charles Shepherd, London (GB); Joanna Peller, London (GB); Jennifer Yip, Wembley (GB); Marco Diciolla, London (GB); Matthew Todd, London (GB); Peter Maag, Brooklyn, NY (US); Spencer Tank, Princeton, NJ (US); Thomas Powell, London (GB)

(73) Assignee: Palantir Technologies Inc., Palo Alto, CA (US)

( * ) Notice: Subject to any disclaimer, the term of this patent is extended or adjusted under 35 U.S.C. 154(b) by 0 days.

(21) Appl. No.: 15/841,984

(22) Filed: Dec. 14, 2017

(65) Prior Publication Data
US 2018/0174067 A1    Jun. 21, 2018

(30) Foreign Application Priority Data

Dec. 16, 2016  (GB) .................................. 1621434.8
Mar. 20, 2017  (EP) ..................................... 17161857

(51) Int. Cl.
*G06N 7/00*      (2006.01)
*G06N 20/00*     (2019.01)
(Continued)

(52) U.S. Cl.
CPC ............... *G06N 7/005* (2013.01); *G01D 9/00* (2013.01); *G05B 23/0221* (2013.01);
(Continued)

(58) Field of Classification Search
None
See application file for complete search history.

(56) References Cited

U.S. PATENT DOCUMENTS 6,625,589 B1 *  9/2003  Varma ................ G05B 23/0289
                                                        700/79
6,836,749 B1 * 12/2004  Sampson ............... G06Q 10/06
                                                        702/113

(Continued)

FOREIGN PATENT DOCUMENTS

EP         2728429          5/2014
EP         2816431         12/2014

(Continued)

OTHER PUBLICATIONS

Official Communication for European Patent Application No. 17161857.2 dated Dec. 13, 2017.

(Continued)

*Primary Examiner* — Paulinho E Smith
(74) *Attorney, Agent, or Firm* — Sheppard Mullin Richter & Hampton LLP

(57) ABSTRACT

Systems, methods, non-transitory computer readable media can be configured to access a plurality of sensor logs corresponding to a first machine, each sensor log spanning at least a first period. Access first computer readable logs corresponding to the first machine, each computer readable log spanning at least the first period, the computer readable logs comprising a maintenance log comprising a plurality of maintenance task objects, each maintenance task object comprising a time and a maintenance task type. Determine a set of statistical metrics derived from the sensor logs; determine a set of log metrics derived from the computer readable logs. Determine, using a risk model that receives the statistical metrics and log metrics as inputs, fault prob- (Continued)

abilities or risk scores indicative of one or more fault types occurring in the first machine within a second period.

20 Claims, 17 Drawing Sheets

(51) Int. Cl.
| | |
|---|---|
| G06F 16/901 | (2019.01) |
| G05B 23/02 | (2006.01) |
| G06K 9/00 | (2006.01) |
| G06F 17/50 | (2006.01) |
| G01D 9/00 | (2006.01) |

(52) U.S. Cl.
CPC ....... *G05B 23/0237* (2013.01); *G06F 16/901* (2019.01); *G06F 17/5009* (2013.01); *G06K 9/0055* (2013.01); *G06N 20/00* (2019.01)

(56) References Cited

U.S. PATENT DOCUMENTS

| | | | |
|---|---|---|---|
| 6,981,182 B2 * | 12/2005 | Roddy | H04L 1/22 701/31.6 |
| 7,707,058 B2 * | 4/2010 | Suermondt | G06Q 10/06 705/7.25 |
| 8,230,268 B2 * | 7/2012 | Nemecek | G06F 11/008 706/45 |
| 8,615,803 B2 * | 12/2013 | Dacier | G06F 11/0709 706/45 |
| 9,582,781 B1 | 2/2017 | Kearns et al. | |
| 9,705,817 B2 | 7/2017 | Lui et al. | |
| 2005/0081410 A1 | 4/2005 | Furem et al. | |
| 2005/0246590 A1 * | 11/2005 | Lancaster | G06F 11/076 714/47.2 |
| 2010/0138694 A1 * | 6/2010 | Harrison | G06F 11/0739 714/26 |
| 2011/0231169 A1 | 9/2011 | Furem et al. | |
| 2011/0288660 A1 * | 11/2011 | Wojsznis | G05B 23/024 700/30 |
| 2012/0317058 A1 | 12/2012 | Abhulimen | |
| 2013/0080641 A1 | 3/2013 | Lui et al. | |
| 2013/0159240 A1 * | 6/2013 | Singh | G05B 23/0275 706/51 |
| 2014/0324495 A1 | 10/2014 | Zhou et al. | |
| 2014/0324862 A1 | 10/2014 | Bingham et al. | |
| 2014/0331277 A1 | 11/2014 | Frascadore et al. | |
| 2016/0146709 A1 * | 5/2016 | Dey | G07C 3/00 702/183 |
| 2016/0203407 A1 * | 7/2016 | Sasaki | G06Q 10/20 706/11 |
| 2016/0247129 A1 | 8/2016 | Song et al. | |
| 2016/0350671 A1 | 12/2016 | Robert et al. | |
| 2017/0083390 A1 | 3/2017 | Talwadker et al. | |
| 2017/0337124 A1 * | 11/2017 | Maag | G06F 11/3692 |
| 2018/0173216 A1 | 6/2018 | Spiro et al. | |
| 2018/0173217 A1 | 6/2018 | Spiro et al. | |

FOREIGN PATENT DOCUMENTS

| | | |
|---|---|---|
| WO | WO 2011/036809 | 3/2011 |
| WO | WO 2014/117245 | 8/2014 |

OTHER PUBLICATIONS

Official Communication for European Patent Application No. 17162421.6 dated Sep. 6, 2017.
Official Communication for U.S. Appl. No. 15/838,122 dated Sep. 21, 2018.
Official Communication for U.S. Appl. No. 15/838,122 dated Feb. 8, 2019.
Official Communication for U.S. Appl. No. 15/839,743 dated Apr. 6, 2018.
Official Communication for U.S. Appl. No. 15/839,743 dated Nov. 1, 2018.

* cited by examiner

MACHINE FAULT MODELLING

FIELD OF THE DISCLOSURE

The present disclosure relates to a method and systems for modelling the fault probability of machinery. The present disclosure also relates to preventing faults from developing in machinery.

BACKGROUND

Machines are increasingly being fitted with sensors to record and control the functions of the machine and sub-systems of the machine. For example, a diesel engine for construction machinery such as, for example, a bulldozer, digger and so forth may include sensors which measure, amongst other variables, injected fuel pressure, mass-flow of air into the engine, engine temperature, oxygen concentration in the outlet gases and so forth, to allow precise adjustments of the fuel/air mix. Similarly, a ship typically includes hundreds, thousands or tens of thousands of sensors measuring parameters such as speed, fuel temperature, stresses in the propeller shafts and so forth. Many ships are powered by marine diesel engines, liquefied natural gas (LNG) engines or combi-fuel engines which may be powered using diesel or LNG. Some ships may include gas-turbine engines. Regardless of the particular type of engine, ship engines similarly include large numbers of sensors for operational, monitoring and diagnostic purposes.

Often, sensors fitted to machines are linked to local electronic processors which control a local process and/or provide a warning or fault message when a physical parameter measured by a sensor moves outside of a predefined range. Such controls and monitoring are based on a local view or on assumptions about the behaviour of a subsystem and interrelated sub-systems of a machine.

SUMMARY

According to some embodiments of this specification, there is provided a method of determining a fault probability for a first machine. The method is performed using one or more processors or special-purpose computing hardware. The method includes accessing a plurality of sensor logs corresponding to a first machine, each sensor log spanning at least a first period. The method also includes accessing first computer readable logs corresponding to the first machine, each computer readable log spanning at least the first period. The computer readable logs include a maintenance log including a plurality of maintenance task objects, each maintenance task object including a time and a maintenance task type. The method also includes determining a set of statistical metrics derived from the sensor logs. The method also includes determining a set of log metrics derived from the computer readable logs. The method also includes determining, using a risk model that receives the statistical metrics and log metrics as inputs, fault probabilities or risk scores indicative of one or more fault types occurring in the first machine within a second period.

The computer readable logs for each machine may also include a message log which includes a plurality of message objects, each message object including a time and a message type.

The computer readable logs for each machine may also include a fault log which includes a plurality of fault objects, each fault object including a time, a duration and a fault type.

The risk model may be a machine learning model configured to receive the statistical metrics and log metrics as inputs, and to output fault probabilities corresponding to one or more fault types occurring in the first machine within a second period.

The machine learning model may be a random forest model. The machine learning model may be a kernel random forest. The machine learning model may be an artificial neural network. The machine learning model may be a Bayesian network. The machine learning model may be a hidden Markov model.

The risk model may be a weighted average model including one or more fault criteria groups, each fault criteria group corresponding to a fault type. Each fault criteria group may include a plurality of statistical criteria and/or a plurality of log criteria, and a set of weighting values, each weighting value corresponding to a statistical criterion or a log criterion. Determining risk scores may include, for each fault criteria group, determining, based on the statistical metrics, whether one or more statistical criteria are satisfied, determining, based on the log criteria, whether one or more log criteria are satisfied and, in dependence upon at least one statistical criterion or at least one log criterion are satisfied, calculating a risk score for the fault criteria group by summing the weighting values corresponding to each satisfied criterion.

Each weighting value may be a fault probability value and each risk score may take the form of an overall probability of the corresponding fault type. Each weighting value may be an importance metric. An importance metrics associated with a criterion may be based on the relative importance of a machine, sub-system or group of sub-systems associated with the criterion.

The method may also include accessing a plurality of second computer readable logs corresponding to one or more second machines which are the same as the first machine. The computer readable logs for each second machine may include a maintenance log which includes a plurality of maintenance task objects, each maintenance task object including a time and a maintenance task type. The computer readable logs for each second machine may include a fault log which includes a plurality of fault objects, each fault object including a time, a duration and a fault type. The method may also include determining a fault metric for each fault type based on the fault probabilities. The method may also include determining a priority fault type based on the fault metric. The method may also include analysing the maintenance logs and fault logs belonging to the plurality of second computer readable logs to correlate the priority fault type with a priority maintenance task. The method may also include outputting the priority maintenance task.

The priority maintenance task may be a maintenance task which is most frequently carried out in response to occurrence of the priority fault type.

The second computer readable logs may also include, for each second machine a message log including a plurality of message objects, each message object comprising a time and a message type.

The fault metric for each fault type may be a product of a fault probability for that fault type and an average duration for that fault type determined based on the second computer readable logs.

The method may also include determining, based on the priority maintenance task type, a change in the probabilities for each fault type which would result if the priority maintenance task was subsequently performed.

The method may also include processing one or more sensor logs using a dynamic time-warping technique to obtain corresponding warped sensor logs, and wherein one or more statistical metrics may be determined from the warped sensor logs.

According to some embodiments of the present specification there is provided a method of generating a machine learning model for use in the method of determining a fault probability for a first machine. The method is performed using one or more processors or special-purpose computing hardware. The method includes accessing a plurality of sensor logs corresponding to one or more machines. The method also includes accessing computer readable logs corresponding to the one or more machines. The computer readable logs for each machine include a maintenance log which includes a plurality of machine maintenance task objects, each maintenance task object including a time and a machine maintenance task type. The computer readable logs for each machine also include a fault log which includes a plurality of machine fault objects, each machine fault object including a time, a duration and a fault type. The method also includes determining a set of statistical metrics derived from the sensor logs. The method also includes determining a set of log metrics derived from the maintenance log or logs. The method also includes preparing a training set comprising the statistical metrics, log metrics and fault logs. The method also includes generating a machine learning model derived from the training set, wherein the machine learning model is configured to determine, based on statistical metrics and log metrics corresponding to a machine and spanning a first period, a probability of each fault type occurring for that machine during a second period.

The machine learning model may be a random forest model. The machine learning model may be a kernel random forest. The machine learning model may be an artificial neural network. The machine learning model may be a Bayesian network. The machine learning model may be a hidden Markov model.

The computer readable logs for each machine may also include a message log comprising a plurality of message objects, each message object comprising a time and a message type. The training set may also include a set of log metrics determined derived from the message log or logs.

One or more sensor logs may be processed using a dynamic time-warping technique to obtain corresponding warped sensor logs, and one or more statistical metrics may be determined from the warped sensor logs.

According to some embodiments of the present specification there is provided a method of generating a weighted average model for use in the method of determining a fault probability for a first machine. The method is performed using one or more processors or special-purpose computing hardware. The method includes accessing a plurality of sensor logs corresponding to one or more machines. The method also includes accessing computer readable logs corresponding to the one or more machines. The computer readable logs for each machine include a maintenance log which includes a plurality of machine maintenance task objects, each maintenance task object including a time and a machine maintenance task type. The computer readable logs for each machine also include a fault log which includes a plurality of machine fault objects, each machine fault object including a time, a duration and a fault type. The method also includes determining a set of statistical metrics derived from the sensor logs. The method also includes determining a set of log metrics derived from the maintenance log or logs. The method also includes preparing a training set which includes the statistical metrics, log metrics and fault logs. The method also includes generating weighting values for one or more fault criteria groups, each fault criteria group corresponding to a fault type and including a plurality of statistical criteria and/or a plurality of log criteria. Generating weighting values for a fault criteria group includes, for each corresponding statistical criterion and/or each log criterion, determining, based on the statistical metrics or log metrics, a first number of occasions for which the criterion was satisfied, determining, based on the fault log and the statistical metrics or log metrics, a second number of occasions for which the criterion was satisfied and the corresponding fault type occurred within a period following satisfaction of the criterion, and calculating the weighting value for the criterion by dividing the second number by the first number.

According to some embodiments of the present specification there is provided a computer program, optionally stored on a non-transitory computer readable medium program which, when executed by one or more processors of a data processing apparatus, causes the data processing apparatus to carry out a method according to any preceding claim.

According to some embodiments of the present specification, there is provided apparatus configured to carry out the methods according to the preceding embodiments, the apparatus including one or more processors or special-purpose computing hardware.

According to some embodiments of the present specification there is provided apparatus for determining a fault probability for a first machine. The apparatus includes one or more processors or special-purpose computing hardware configured to access a plurality of sensor logs corresponding to a first machine, each sensor log spanning at least a first period, and to access first computer readable logs corresponding to the first machine, each computer readable log spanning at least the first period. The computer readable logs include a maintenance log which includes a plurality of maintenance task objects, each maintenance task object including a time and a maintenance task type. The apparatus also includes a statistical metric determining module configured to determine a set of statistical metrics derived from the sensor logs. The apparatus also includes a log metric determining module configured to determine a set of log metrics derived from the computer readable logs. The apparatus also includes a risk modelling module configured to determine, using a risk model that receives the statistical metrics and log metrics as inputs, fault probabilities or risk scores indicative of one or more fault types occurring in the first machine within a second period.

The risk model may be a machine learning model configured to receive the statistical metrics and log metrics as inputs, and to output fault probabilities corresponding to one or more fault types occurring in the first machine within a second period.

The machine learning model may be a random forest model. The machine learning model may be a kernel random forest. The machine learning model may be an artificial neural network. The machine learning model may be a Bayesian network. The machine learning model may be a hidden Markov model.

The risk model may be a weighted average model including one or more fault criteria groups, each fault criteria group corresponding to a fault type. Each fault criteria group may include a plurality of statistical criteria and/or a plurality of log criteria, and a set of weighting values, each weighting value corresponding to a statistical criterion or a log criterion. Determining risk scores may include, for each fault criteria group, determining, based on the statistical metrics, whether one or more statistical criteria are satisfied, determining, based on the log criteria, whether one or more log criteria are satisfied, and in dependence upon at least one statistical criterion or at least one log criterion are satisfied, calculating a risk score for the fault criteria group by summing the weighting values corresponding to each satisfied criterion.

Each weighting value may be a fault probability value and each risk score may take the form of an overall probability of the corresponding fault type. Each weighting value may be an importance metric. An importance metrics associated with a criterion may be based on the relative importance of a machine, sub-system or group of sub-systems associated with the criterion.

The apparatus may also be configured to access a plurality of second computer readable logs corresponding to one or more second machines which are the same as the first machine. The computer readable logs for each second machine may include a maintenance log which includes a plurality of maintenance task objects, each maintenance task object including a time and a maintenance task type. The computer readable logs for each second machine may also include a fault log which includes a plurality of fault objects, each fault object including a time, a duration and a fault type. The apparatus may also include a maintenance task determining module configured to determine a fault metric for each fault type based on the fault probabilities and to determine a priority fault type based on the fault metric. The apparatus may also include a fault maintenance correlation module configured to analyse the maintenance logs and fault logs belonging to the plurality of second computer readable logs to correlate the priority fault type with a priority maintenance task. The maintenance task determining module may also be configured to output the priority maintenance task.

According to some embodiments of the present specification, there is provided apparatus for generating a machine learning model for use in the apparatus for determining a fault probability for a first machine. The apparatus includes one or more processors or special-purpose computing hardware configured to access a plurality of sensor logs corresponding to one or more machines, and to access computer readable logs corresponding to the one or more machines. The computer readable logs for each machine include a maintenance log which includes a plurality of machine maintenance task objects, each maintenance task object including a time and a machine maintenance task type. The computer readable logs for each machine also include a fault log which includes a plurality of machine fault objects, each machine fault object including a time, a duration and a fault type. The apparatus also includes a statistical metric determining module configured to determine a set of statistical metrics derived from the sensor logs. The apparatus also includes a log metric determining module configured to determine a set of log metrics derived from the maintenance log or logs. The apparatus also includes a training set formatting module configured to prepare a training set which includes the statistical metrics, log metrics and fault logs. The apparatus also includes a risk modelling module configured to generate a machine learning model derived from the training set, wherein the machine learning model is configured to determine, based on statistical metrics and log metrics corresponding to a machine and spanning a first period, a probability of each fault type occurring for that machine during a second period.

The machine learning model may be a random forest model. The machine learning model may be a kernel random forest. The machine learning model may be an artificial neural network. The machine learning model may be a Bayesian network. The machine learning model may be a hidden Markov model.

According to some embodiments of the present specification there is provided apparatus for generating a weighted average model for use in the apparatus for determining a fault probability for a first machine. The apparatus includes one or more processors or special-purpose computing hardware configured to access a plurality of sensor logs corresponding to one or more machines and to access computer readable logs corresponding to the one or more machines. The computer readable logs for each machine include a maintenance log which includes a plurality of machine maintenance task objects, each maintenance task object including a time and a machine maintenance task type. The computer readable logs for each machine also include a fault log which includes a plurality of machine fault objects, each machine fault object including a time, a duration and a fault type. The apparatus also includes a statistical metric determining module configured to determine a set of statistical metrics derived from the sensor logs. The apparatus also includes a log metric determining module configured to determine a set of log metrics derived from the maintenance log or logs. The apparatus also includes a training set formatting module configured to prepare a training set which includes the statistical metrics, log metrics and fault logs. The apparatus also includes a risk modelling module configured to generate weighting values for one or more fault criteria groups, each fault criteria group corresponding to a fault type and including a plurality of statistical criteria and/or a plurality of log criteria. The risk modelling module is configured to generate weighting values for a fault criteria group by, for each corresponding statistical criterion and/or each log criterion, determining, based on the statistical metrics or log metrics, a first number of occasions for which the criterion was satisfied, determining, based on the fault log and the statistical metrics or log metrics, a second number of occasions for which the criterion was satisfied and the corresponding fault type occurred within a period following satisfaction of the criterion, and calculating the weighting value for the criterion by dividing the second number by the first number.

DETAILED DESCRIPTION OF CERTAIN EMBODIMENTS

Figure 1:
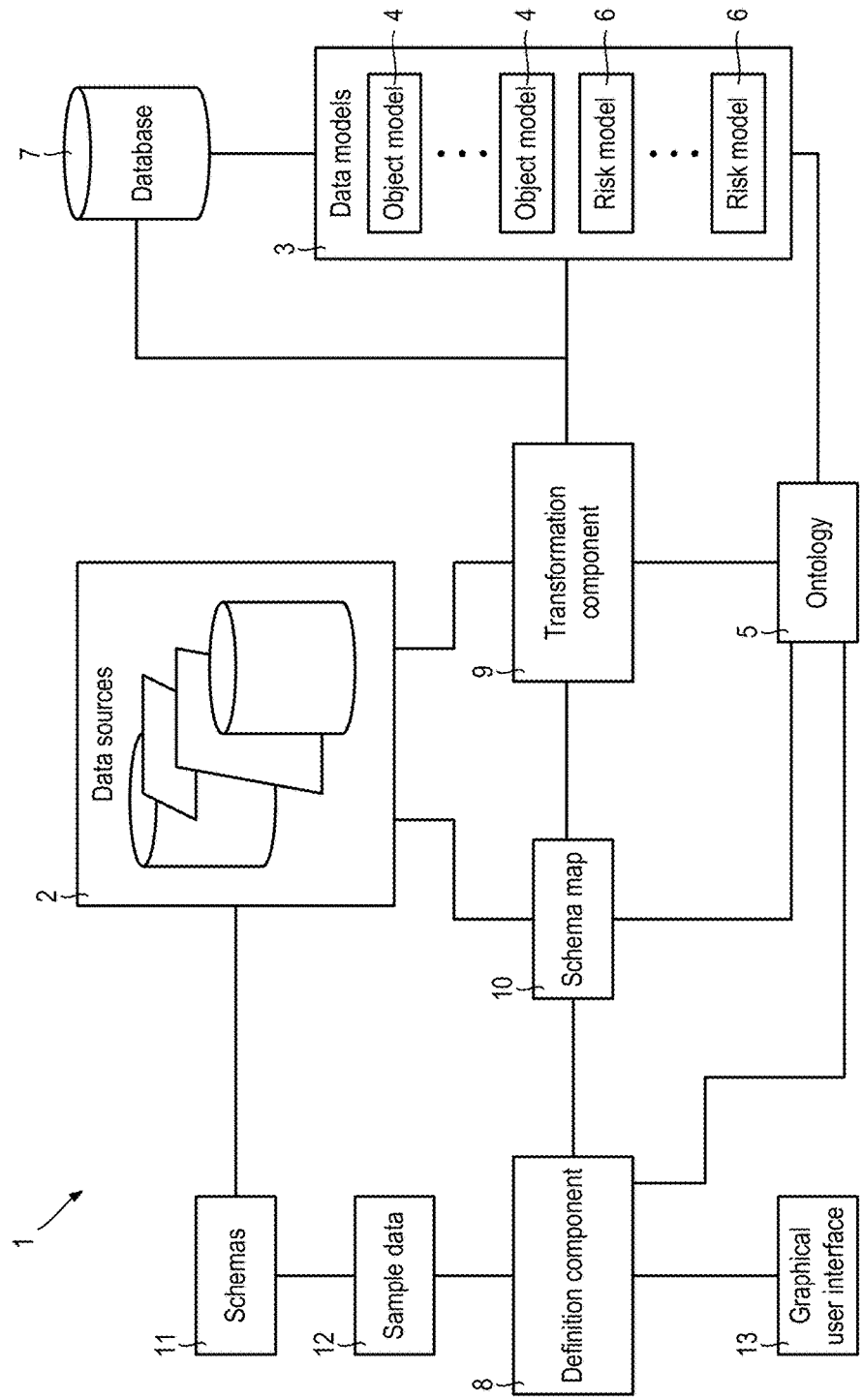
FIG. 1 is a block diagram illustrating a data fusion system according to embodiments of this specification for providing interactive data analysis.

In brief, this specification describes processing of history data for a machine in order to determine the probability, or a risk score, of the machine, or a component sub-system of the machine, experiencing a fault during a future interval. This specification further describes using the fault probabilities or risk scores determined for a machine to select a preventative maintenance task which can reduce the probability and/or severity of the machine experiencing a fault.

History data for a machine includes sensor logs, a sensor log being multiple measurements of physical parameters captured by a sensor and relating to different points in time (a time series). History data for a machine also includes computer readable logs such as maintenance logs, fault logs and message logs corresponding to a machine. The maintenance log corresponding to the machine records information such as dates and locations of prior maintenance tasks, details of replacement parts, free text notes made by an engineer or mechanic performing a maintenance task and so forth. The fault log corresponding to the machine records information such as dates and locations of faults, the types of faults, the period of time required to rectify each fault and so forth. The message log corresponding to a machine, such as a ship or construction machinery, records messages generated by controllers, processors or similar devices which are integrated into the component sub-systems of the machine. The messages may include a date and time, an identifier of a component sub-system, and message content such as, for example, warning information of information identifying a fault.

In some embodiments, a fault probability or risk score for a first machine is generated by processing the history data for the first machine to generate statistical metrics based on the sensor logs, and to generate log metrics based on the computer readable logs. The statistical metrics and log metrics provide inputs to a risk model which generates probabilities or risk scores that the machine, or a component sub-system of the machine, will experience a fault during a future interval. A risk model may take the form of a machine learning model or a weighted average model. Based on the fault probabilities or risk scores generated in this way, and also history data from a number of machines which are the same or similar to the first machine, a priority maintenance task can be determined which reduces the probability that the machine, or a component sub-system of the machine, will experience a fault during the future interval.

In some embodiments, a risk model, in the form of a machine learning model or a weighted average model is generated. The risk model is generated using a training set which includes history data corresponding to a number of machines which are the same as, or similar to, one another. In the training set used to generate the risk model, the fault logs provide test outputs, and the sensor logs, maintenance logs and, optionally, message logs and fault logs provide test inputs.

These embodiments can be useful in relation to preventative maintenance of machines. Conventionally, regular maintenance of machines is used to maintain machines in working order. Regular maintenance of a machine includes a mixture of tasks which are performed according to a schedule, for example checking and topping off pressures or fluid levels. Regular maintenance of a machine also includes preventative maintenance such as, for example, replacement of parts, purging and cleaning a fluid system before re-filling, and so forth. Conventionally, the time available for preventative maintenance is limited, and the decisions about which maintenance tasks to perform can be determined on an ad-hoc or "gut instinct" basis, or according to a cycle or schedule of predetermined maintenance tasks.

Regular maintenance of machines may fall into a number of different categories. For example, for a machine in the form of a ship, some maintenance tasks may be carried out in service, i.e. whilst the ship is at sea. However, other maintenance tasks may require port facilities, or other specialist equipment and/or personnel, for example divers. Still further maintenance tasks for a ship may require that the ship is in drydock, i.e. removed from the water.

Risk models generated in accordance with this specification may be used to predict the probability that a machine, or a component sub-system of the machine, will experience a fault during a future interval, based on the history of the machine and/or comparable machines. Risk models generated in accordance with this specification may be used to reduce the likely severity of a fault which may be experienced by a machine, or a component sub-system of the machine, during a future interval. This provides valuable technical information about the condition of the machine.

Priority maintenance tasks determined according to this specification can reduce the probability that a machine, or a component sub-system of the machine, will experience a fault during a future interval. Priority maintenance tasks determined according to this specification can reduce the likely severity of a fault which may be experienced by a machine, or a component sub-system of the machine, during a future interval. In this way, decisions relating to preventative maintenance can be placed on a quantitative footing and the rate of failure of machines in use can be reduced but without requiring the performance of excessive preventative maintenance. For example, if the risk model determines a high probability of a fault developing in a ship system which cannot, or cannot easily be repaired whilst the ship is at sea, the at risk system may be prioritised during maintenance time before the ship leaves port.

Instead of trying to predict precisely when a machine will fail, which may be impractical in many situations, this specification aims to determine a priority maintenance task which will provide the greatest reduction of the probability that a machine, or a component sub-system of the machine, will experience a fault during a future interval but without requiring the performance of excessive preventative maintenance. This specification aims to determine a priority maintenance task which will provide the greatest reduction of a likely severity of a fault which may be experienced by a machine, or a component sub-system of the machine, during a future interval.

Reference will now be made to certain examples which are illustrated in the accompanying drawings. Whenever possible, the same reference numbers will be used throughout the drawings to refer to the same or like parts.

FIG. 1 illustrates, in block diagram form, an exemplary data fusion system 1 for providing interactive data analysis, consistent with embodiments of the present disclosure. Among other things, data fusion system 1 facilitates analysis and transformation of one or more data sources 2 such as, for example, sensors 19 (FIG. 2), maintenance logs 16 (FIG. 2), fault logs 17 (FIG. 2), message logs 21 (FIG. 2) and so forth, into data models 3. Data models 3 may include one or more object models 4 whose semantics are defined by an ontology 5. Data models 3 may also include one or more risk models 6 for calculating a failure probability or risk score for a machine 15, or a sub-system 18 of the machine, during a particular interval. Risk models 6 are machine learning models or weighted average models generated in dependence upon data accessed from the data sources 2. The transformation can be performed for a variety of reasons. For example, an engineer or mechanic may import data from data sources 2 into a database 7 for persistently storing object model(s) 4. As another example, an engineer or mechanic may import data from data sources 2 in order to define, refine or apply a risk model 6. As another example, a data presentation component can transform input data from data sources 2 "on the fly" (in substantially real time, as the data is generated) into object model(s) 4. The object model(s) 4 can then be utilized, in conjunction with ontology 5, for analysis through graphs and/or other data visualization techniques. Data from data sources 2 may take the form of numerical data, text information in defined or free-text formats, or a combination of numerical, textual and/or other data types. Data from data sources 2 may be analysed to extract metrics in the process of transforming the data into object models 4 and/or risk models 6.

Data fusion system 1 includes a definition component 8 and a translation component 9, both implemented by one or more processors of one or more computing devices or systems executing hardware and/or software-based logic for providing various functionality and features of the present disclosure, as described herein. The data fusion system 1 can comprise fewer or additional components that provide the various functionalities and features described herein. Moreover, the number and arrangement of the components of data fusion system 1 which are responsible for providing the various functionalities and features described herein can further vary between different examples of the data fusion system 1.

The definition component 8 generates and/or modifies the ontology 5 and a schema map 10. Examples of defining an ontology (such as ontology 5) are described in U.S. Pat. No. 7,962,495 (the '495 patent), issued on Jun. 14, 2011, the entire contents of which are expressly incorporated herein by reference for all purposes. Consistent with certain examples disclosed in the '495 patent, a dynamic ontology may be used to create a database, for example database 7. To create a database ontology, one or more object types may be defined, where each object type includes one or more properties. The attributes of object types or property types of the ontology can be edited or modified at any time. At least one parser definition may be created for each property type. The attributes of a parser definition can be edited or modified at any time.

In some examples, each property type is declared to be representative of one or more object types. A property type is representative of an object type when the property type is intuitively associated with the object type. In some embodiments, each property type has one or more components and a base type. In some embodiments, a property type can comprise a string, a date, a number, or a composite type consisting of two or more string, date, or number elements. Thus, property types are extensible and can represent complex data structures. Further, a parser definition can reference a component of a complex property type as a unit or token.

An example of a property having multiple components is an "engine temperatures" property having an "exhaust temperature" component and an "inlet temperature" component. For example, the "inlet temperature" may correspond to the temperature of ambient air drawn into a diesel engine and the "exhaust temperature" may correspond to the temperature of exhaust gasses expelled from the diesel engine. An example of raw input data is "300 K". An example parser definition specifies an association of imported input data to object property components as follows: {EXHAUST TEMPERATURE}, {INLET TEMPERATURE} →EngineTemperatures:ExhaustTemperature, EngineTemperatures:InletTemperature. In some embodiments, the association {EXHAUST TEMPERATURE}, {INLET TEMPERATURE} is defined in a parser definition using regular expression symbology. The association {EXHAUST TEMPERATURE}, {INLET TEMPERATURE} indicates that an exhaust temperature followed by an inlet temperature, and separated by a comma, comprises valid input data for a property of type "engine temperature".

According to some embodiments, schema map 10 can define how various elements of schemas 11 for data sources 2 map to various elements of ontology 5. Definition component 8 receives, calculates, extracts, or otherwise identifies schemas 11 for data sources 2. Schemas 11 define the structure of data sources 2; for example, the names and other characteristics of tables, files, columns, fields, properties, and so forth. Furthermore, definition component 8 optionally identifies sample data 12 from data sources 2. Definition component 8 can further identify object type, relationship, and property definitions from ontology 5, if any already exist. Definition component 8 can further identify pre-existing mappings from schema map 10, if such mappings exist. Some data sources 2 may be substantially unstructured, for example, in the form of free-text which is analysed for keywords and/or using natural language processing. For substantially unstructured data sources, the schema map 10 may define how various elements of schemas 11 map to ontology 5 for processing free-text, for example parameters or semantic rules.

Based on the identified information, definition component 8 can generate a graphical user interface 13. Graphical user interface 13 can be presented to users of a computing device via any suitable output mechanism (e.g., a display screen, an image projection, etc.), and can further accept input from users of the computing device via any suitable input mechanism (e.g., a keyboard, a mouse, a touch screen interface, etc.). Graphical user interface 13 features a visual workspace that visually depicts representations of the elements of ontology 5 for which mappings are defined in schema map 10.

In some embodiments, transformation component 9 can be invoked after schema map 10 and ontology 5 have been defined or redefined. Transformation component 9 identifies schema map 10 and ontology 5. Transformation component 9 further reads data sources 2 and identifies schemas 11 for data sources 2. For each element of ontology 5 described in schema map 10, transformation component 9 iterates through some or all of the data items of data sources 2, generating elements of object model(s) 4 in the manner specified by schema map 10. In some examples, the transformation component 9 may process data from data sources 2 to generate statistical or other metrics based on the data. The statistical or other metrics may be stored in the database 7. In some examples, the transformation component 9 may generate one or more risk models 6 based on the data from data sources 2. Risk models 6 generated by the transformation component 9 may be stored in the database 7. In some examples, the transformation component 9 may apply risk models 6 to data from data sources 2 in order to calculate a failure probability or risk score for a machine within a specified interval. In some examples, transformation component 9 can store a representation of each generated element of an object model 4 in the database 7. In some examples, transformation component 9 is further configured to synchronize changes in the object model(s) 4 back to data sources 2.

Data sources 2 can be one or more sources of data, including, without limitation, spreadsheet files, databases, email folders, document collections, sensor memory storages, and so forth. Documents may include native electronic documents and scanned documents. Scanned documents may be processed using optical character recognition. Data sources 2 can include data structures stored persistently in non-volatile memory. Data sources 2 can additionally or alternatively include temporary data structures generated from underlying data sources via data extraction components, such as a result set returned from a database server executing a database query.

Schema map 10, ontology 5, and schemas 11 can be stored in any suitable structures, such as XML files, database tables, and so forth. In some embodiments, ontology 5 is maintained persistently. Schema map 10 can or cannot be maintained persistently, depending on whether the transformation process is perpetual, or a one-time event. Schemas 11 need not be maintained in persistent memory, but can be cached for optimization.

The object model(s) 4 comprise collections of elements such as typed objects, numerical data, properties, and relationships. The collections can be structured in any suitable manner. In some examples, a database 7 stores the elements of the object model(s) 4, or representations thereof. In some examples, the elements of an object model 4 are stored within database 7 in a different underlying format, such as in a series of object, property, and relationship tables in a relational database. The risk models 6 comprise collections of elements such as, for example, weighting tables, decision trees, kernels, Bayesian graphs/networks, hidden Markov models, artificial neural networks or similar elements of a machine learning model.

According to some embodiments, the functionalities, techniques, and components described herein are implemented by one or more special-purpose computing devices. The special-purpose computing devices can be hard-wired to perform the techniques, or can include digital electronic devices such as one or more application-specific integrated circuits (ASICs) or field programmable gate arrays (FPGAs) that are persistently programmed to perform the techniques, or can include one or more general purpose hardware processors (each including processor circuitry) programmed to perform the techniques pursuant to program instructions in firmware, memory, other storage, or a combination. Such special-purpose computing devices can also combine custom hard-wired logic, ASICs, or FPGAs with custom programming to accomplish the techniques. The special-purpose computing devices can be desktop computer systems, portable computer systems, handheld devices, networking devices, or any other device that incorporates hard-wired and/or program logic to implement the techniques.

In examples described herein, data fusion system 1 can allow a user, such as an engineer or mechanic, to analyse information and identify underlying trends, patterns, behaviours and/or precursors which allow the engineer or mechanic to make more informed decisions. Such information can allow an engineer or mechanic to determine the most effective maintenance to perform on a machine. Additionally, when a fault or anomaly has developed in a complex machine, an engineer or mechanic may use the data fusion system 1 to obtain information about a root cause of an anomaly or fault. Other applications of the data fusion system 1 shall be described hereinafter.

For purposes of illustration, examples are described herein with reference to ships, for example passenger cruise ships, cargo ships, tankers and so forth. However, the examples and techniques described herein may be applied to other types of machines such as, for example, construction machinery in the form of bulldozers, diggers, any other types of mobile equipment. The examples and techniques described herein may also be applied to further types of machines such as, for example, manufacturing plant, sewage treatment plant, tunneling/boring equipment and so forth, within the spirit and scope of this disclosure.

Figure 2:
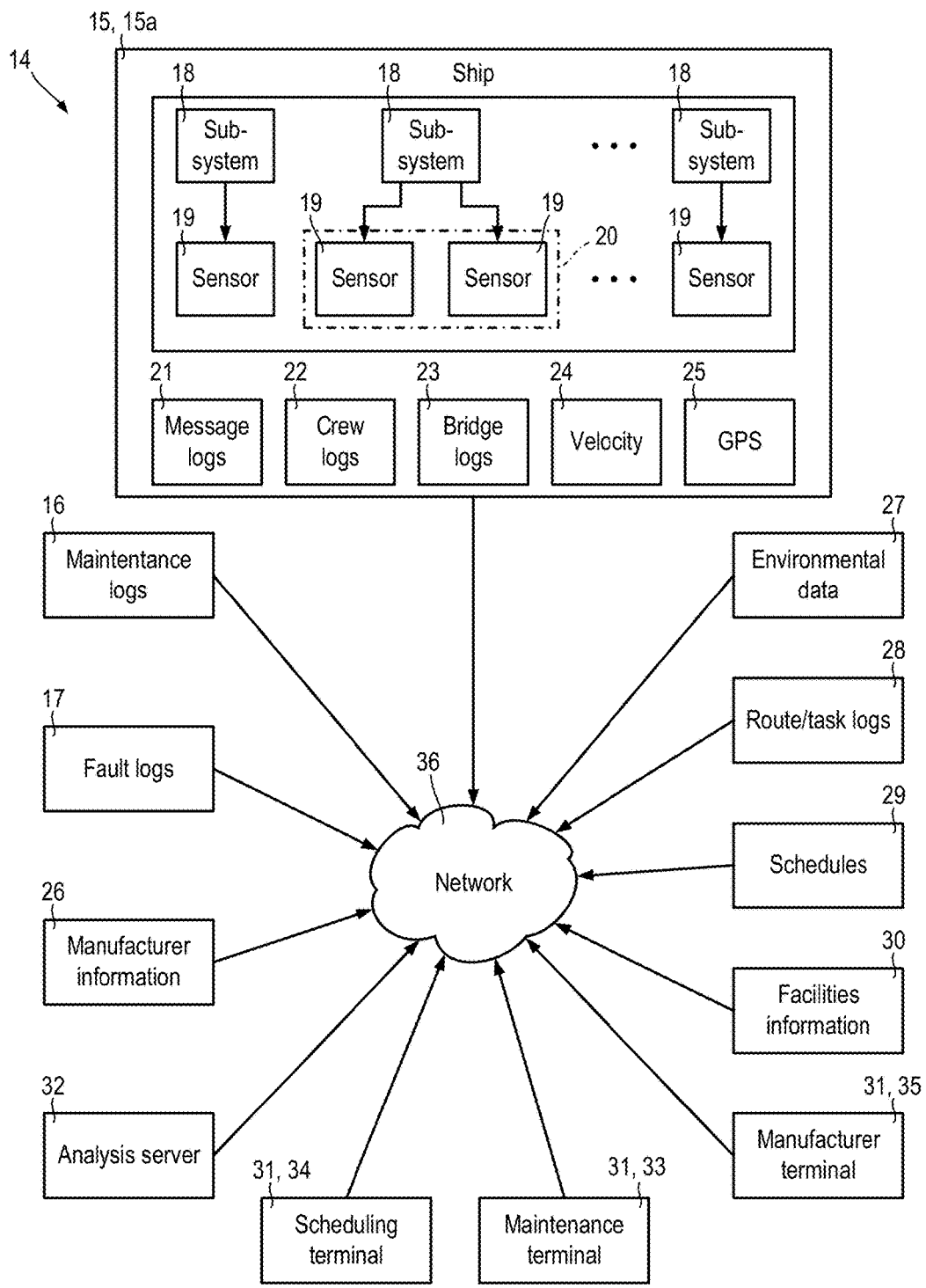
FIG. 2 is a block diagram of a first exemplary system according to embodiments of this specification for analysing and/or modelling a machine.

FIG. 2 shows a block diagram of a first exemplary system 14 for performing one or more operations for analysing and/or modelling a machine 15. In the first system 14, the machine 15 is a ship 15a and the first system 14 can include one or more ships 15a. The ships 15a may be, for example, passenger cruise ships, car transporter ferries, cargo ships, tanker ships, tugs and so forth. Each ship 15a has a corresponding maintenance log 16 and fault log 17. The maintenance log 16 for a ship 15a may include information such as dates and locations of maintenance, details of replacement parts used, free text notes made by an engineer or mechanic performing a maintenance task and so forth. The fault log 17 for a ship 15a may include information such as dates and locations of faults, the type of fault, the period of time required to rectify the fault and so forth. The maintenance logs 16 and fault logs 17 are stored in suitable computer readable formats or structures, such as XML files, database tables, and so forth. The maintenance log 16 and fault log 17 corresponding to a ship 15a may be stored on one or more servers and/or locally on the ship 15a. Maintenance logs 16 and fault logs 17 corresponding to a number of different ships 15*a* may be stored in a common database, for example database 7.

Each ship 15*a* includes a number of sub-systems 18 which may be mechanical systems, electrical systems, computer systems or combinations thereof. For example, sub-systems 18 for a ship 15*a* may include, but are not limited to, a navigational computer system, a crew area and/or cargo area environmental control and monitoring systems, a fuel management system, engine management systems, a hydraulic system, a fire suppression system, a bilge system and so forth. Each sub-system 18 may include one or more sensors 19 which monitor physical parameters of the sub-system. One or more sensors 19 associated with a sub-system form a sensor group 20. Examples of sensors 19 include a temperature sensor, a pressure sensor, a water level sensor, an electrical current or voltage sensor, a gas concentration sensor, a strain gauge, and so forth. Data from sensors 19 may be stored on the ship 15*a* and subsequently transmitted or downloaded from the ship 15*a* according to a schedule, for example upon arrival at a destination port, daily or weekly. Data from some sensors 19 may be transmitted to a central operations centre whilst the ship 15*a* is at sea.

The ship 15*a* may also store message logs 21, crew logs 22, bridge logs 23, velocity logs 24 and global positioning system (GPS) (or other positioning system) logs 25. The message log 21 corresponding to a ship 15*a* may include messages generated by controllers (e.g. an automated bilge pump controller), processors or similar devices which are integrated into the various sub-systems 18. The messages may include a date and time, an identifier of an originating sub-system 18, and message contents such as, for example, a warning or fault identifier. Crew logs 22 corresponding to a ship 15*a* may include forms, notes, checklists or other documents which are produced or confirmed by crew responsible for operating the ship 15*a* such as, for example, the captain, navigator, engineering crew and/or port crew. Crew logs 22 may include information derived from documents which are native electronic documents and/or scanned documents. Bridge logs 23 may include, for example, bridge audio recordings, logs detailing button presses, keystrokes and control inputs during a voyage and so forth. Velocity logs 24 may include a time series of velocities of the ship 15*a*. GPS logs 25 may include a time series of GPS coordinates for the ship 15*a*. Velocity logs and GPS logs are particular examples of sub-systems 18 and sensors 19. Message logs 21, crew logs 22, bridge logs 23, velocity logs 24 and global positioning system (GPS) logs 25 are stored in suitable computer readable formats or structures, such as XML files, database tables and so forth.

The first system 14 may also include manufacturer information 26 including, for example, databases providing information about messages and/or faults, suggested maintenance tasks, and manufacturer recommended tolerances for parameters measured by sensors 19. The first system 14 may also include environmental data 27 such as, for example, information about wind speeds, surface waves, cloud cover, storm systems, currents, tide times as a function of date, time and location. The first system 14 may also include a route/task log 28 corresponding to each ship 15*a*. The route/task log for a ship 15*a* may include details of the start and end locations, dates and times of each voyage conducted by the corresponding ship 15*a*. The first system 14 may also include schedules 29 for the voyages which a fleet including a number of ships 15*a* need to be assigned to travel over a forthcoming time period. The first system 14 may also include facilities information 30 such as, for example, a type or class of available maintenance and repair facilities at a number of ports between which ships 15*a* may be scheduled to travel, for example, whether a port has maintenance and inspection divers, dry-dock facilities and so forth.

The manufacturer information 26, environmental data 27, route logs 28, schedules 29 and facilities information 30 may be stored in suitable computer readable formats or structures, such as XML files, database tables, and so forth. The manufacturer information 26, environmental data 27, route logs 28, schedules 29 and facilities information 30 may be stored in one or more servers.

The maintenance logs 16, fault logs 17, sensors 19, message logs 21, crew logs 22, bridge logs 23, altitude and velocity logs 25, GPS logs 25, manufacturer information 26, environmental data 27, route logs 28, schedules 29 and facilities information 30 are examples of data sources 2 for the data fusion system 1.

The first system 14 includes one or more analysis terminals 31 in the form of one or more computing devices (e.g., computer or computers, server or servers, etc.), memory storing data and/or software instructions (e.g., database or databases), memory devices, etc.), and other known computing components. In some examples, the one or more computing devices are configured to execute software or a set of programmable instructions stored on one or more memory devices to perform one or more operations, consistent with the examples herein. The data fusion system 1 may be provided by one or more analysis servers 32 and one or more analysis terminals 31 may connect to the analysis server 32 as clients. Alternatively, each analysis terminal 31 may provide an example of the data fusion system 1. Examples of analysis terminals 31 may provide the same or different functions. For example, different analysis terminals 31 may be able to access different types of data or functions of the analysis server 32. For example, a maintenance terminal 33 may be able to access preventative maintenance and troubleshooting functions. As another example, a scheduling terminal 34 may access data relating to risk model 6 outputs, schedules 29 and facilities information 30 to perform risk based scheduling of ship 15*a* routes. As another example, a manufacturer terminal 35 may be given access to a reduced or redacted selection of data from the data sources 2, in order to allow monitoring and analysis of technical data whilst preserving the integrity of commercially sensitive information. In some examples, all analysis terminals 31 may access the same data and functions.

The analysis terminals 31 and analysis server 32 communicate with the data sources 2 over a network 36. The network 36 can be any type of network or combination of networks configured to provide electronic communications between components of the first system 14. For example, the network 36 can be any type of network (including infrastructure) that provides communications, exchanges information, and/or facilitates the exchange of information, such as the Internet, a Local Area Network, or other suitable connection(s) that enables the sending and receiving of information between the components of the first system 14. The network 36 may also comprise any combination of wired and wireless networks. In other embodiments, one or more components of the first system 14 can communicate directly through a dedicated communication link or communication links, such as links between analysis terminals 31, analysis server 32, maintenance logs 16, fault logs 17, sensors 19, message logs 21, crew logs 22, bridge logs 23, velocity logs 25, GPS logs 25, manufacturer information 26, environmental data 27, route logs 28, schedules 29 and facilities information 30.

The first system 14 may include a number of machines 15 in the form of ships 15a, and all of the ships 15a forming part of the first system 14 are the same or comparable to one another. Two machines 15 are the same if they include the same components, arranged and configured in the same way. Two machines 15 may be the same if they are manufactured in the same batch or two machines 15 may be the same if they are manufactured in different batches. Two machines 15 which are the same include corresponding sub-systems 18 which are associated with corresponding sensors 19. Two machines 15 are comparable if they contain one or more corresponding sub-systems 18 in common. For two comparable machines 15, the corresponding common sub-systems 18 are not substantially interrelated to other sub-systems 18 which are not common to the machines 15. For example, two ships 15a may be comparable because they are fitted with the same marine diesel engine. Even when data from other systems is not comparable (or not directly comparable), information from engine sensors may be usefully compared between the two comparable ships 15a.

Figure 3:
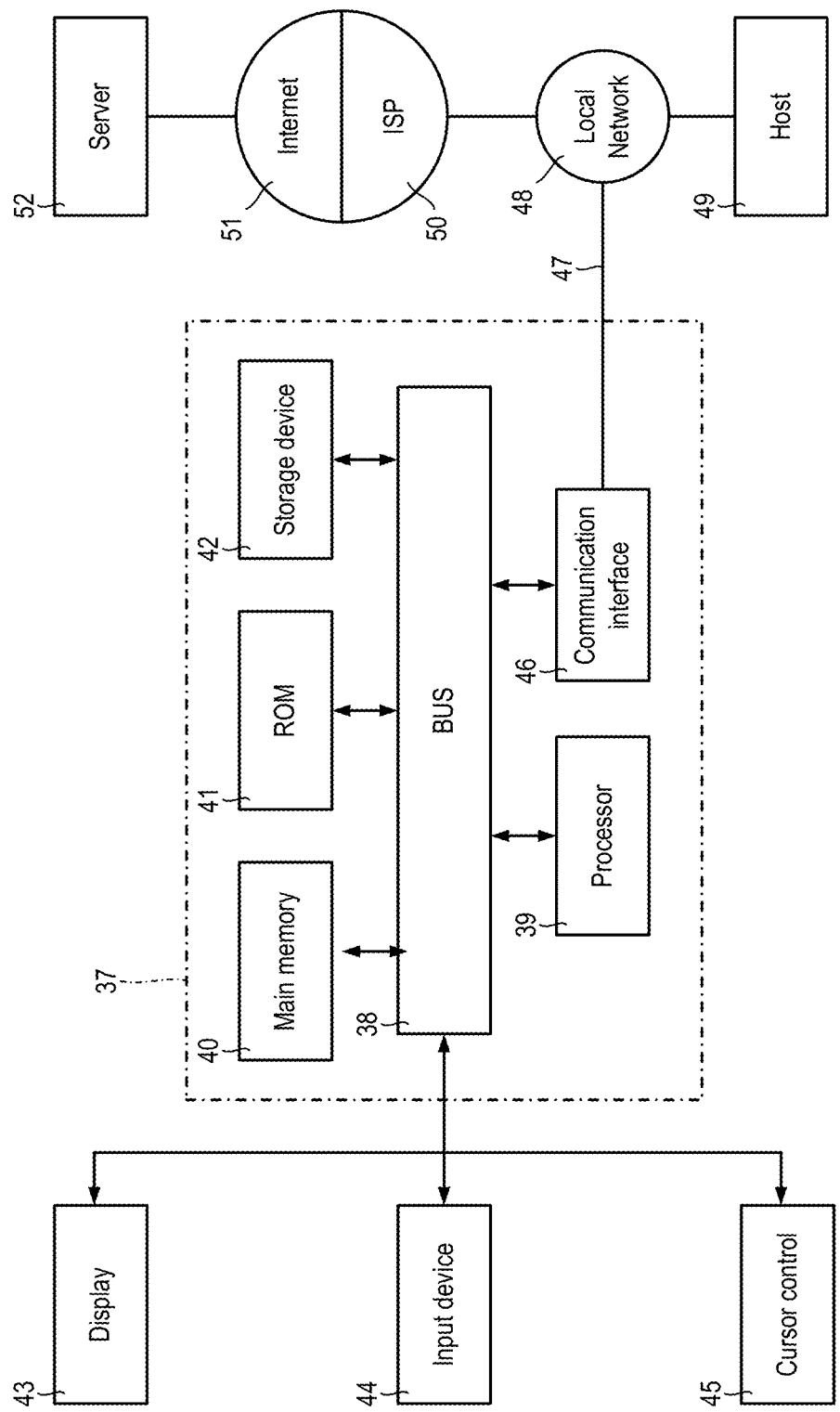
FIG. 3 is a block diagram of a computer system according to embodiments of this specification.

Referring also to FIG. 3, a block diagram of an exemplary computer system 37, consistent with examples of the present specification is shown. The components of the first and second exemplary systems 14, 67 (FIG. 11) such as analysis terminals 31 and analysis server 32 may include an architecture based on or similar to that of computer system 37.

Computer system 37 includes a bus 38 or other communication mechanism for communicating information, and a hardware processor 39 coupled with bus 38 for processing information. Hardware processor 39 can be, for example, a general purpose microprocessor. Hardware processor 39 comprises electrical circuitry.

Computer system 37 includes a main memory 40, such as a random access memory (RAM) or other dynamic storage device, which is coupled to the bus 38 for storing information and instructions to be executed by processor 39. The main memory 40 can also be used for storing temporary variables or other intermediate information during execution of instructions by the processor 39. Such instructions, when stored in non-transitory storage media accessible to the processor 39, render the computer system 37 into a special-purpose machine that is customized to perform the operations specified in the instructions.

Computer system 37 further includes a read only memory (ROM) 41 or other static storage device coupled to the bus 38 for storing static information and instructions for the processor 39. A storage device 42, such as a magnetic disk or optical disk, is provided and coupled to the bus 38 for storing information and instructions.

Computer system 37 can be coupled via the bus 38 to a display 43, such as a cathode ray tube (CRT), liquid crystal display, or touch screen, for displaying information to a user. An input device 44, including alphanumeric and other keys, is coupled to the bus 38 for communicating information and command selections to the processor 39. Another type of user input device is cursor control 45, for example using a mouse, a trackball, or cursor direction keys for communicating direction information and command selections to the processor 39 and for controlling cursor movement on the display 43. The input device typically has two degrees of freedom in two axes, a first axis (for example, x) and a second axis (for example, y), that allows the device to specify positions in a plane.

Computer system 37 can implement the techniques described herein using customized hard-wired logic, one or more ASICs or FPGAs, firmware and/or program logic which in combination with the computer system causes or programs computer system 37 to be a special-purpose machine. According to some embodiments, the operations, functionalities, and techniques disclosed herein are performed by computer system 37 in response to the processor 39 executing one or more sequences of one or more instructions contained in the main memory 40. Such instructions can be read into the main memory 40 from another storage medium, such as storage device 42. Execution of the sequences of instructions contained in main memory 40 causes the processor 39 to perform the process steps described herein. In alternative embodiments, hard-wired circuitry can be used in place of or in combination with software instructions.

The term "storage media" as used herein refers to any non-transitory media that stores data and/or instructions that cause a machine to operate in a specific fashion. Such storage media can comprise non-volatile media and/or volatile media. Non-volatile media includes, for example, optical or magnetic disks, such as storage device 42. Volatile media includes dynamic memory, such as main memory 40. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from, but can be used in conjunction with, transmission media. Transmission media participates in transferring information between storage media. For example, transmission media includes coaxial cables, copper wire and fibre optics, including the wires that comprise bus 38. Transmission media can also take the form of acoustic or light waves, such as those generated during radio-wave and infra-red data communications.

Various forms of media can be involved in carrying one or more sequences of one or more instructions to processor 39 for execution. For example, the instructions can initially be carried on a magnetic disk or solid state drive of a remote computer. The remote computer can load the instructions into its dynamic memory and send the instructions over a telephone line or other transmission medium using a modem. A modem local to computer system 37 can receive the data on the telephone line or other transmission medium and use an infra-red transmitter to convert the data to an infra-red signal. An infra-red detector can receive the data carried in the infra-red signal and appropriate circuitry can place the data on bus 38. Bus 38 carries the data to the main memory 40, from which the processor 39 retrieves and executes the instructions. The instructions received by the main memory 40 can optionally be stored on the storage device 42 either before or after execution by the processor 39.

Computer system 37 also includes a communication interface 46 coupled to the bus 38. The communication interface 46 provides a two-way data communication coupling to a network link 47 that is connected to a local network 48. For example, the communication interface 46 can be an integrated services digital network (ISDN) card, cable modem, satellite modem, or a modem to provide a data communication connection to a corresponding type of telephone line. As another example, the communication interface 46 can be a local area network (LAN) card to provide a data communication connection to a compatible LAN. Wireless links can also be implemented. In any such implementation, the communication interface 46 sends and receives electrical, electromagnetic or optical signals that carry digital data streams representing various types of information.

The network link 47 typically provides data communication through one or more networks to other data devices. For example, the network link 47 can provide a connection through the local network 48 to a host computer 49 or to data equipment operated by an Internet Service Provider (ISP) 50. The ISP 50 in turn provides data communication services through the world wide packet data communication network now commonly referred to as the "Internet" 51. The local network 48 and internet 51 both use electrical, electromagnetic or optical signals that carry digital data streams. The signals through the various networks and the signals on the network link 47 and through the communication interface 46, which carry the digital data to and from the computer system 37, are example forms of transmission media.

The computer system 37 can send messages and receive data, including program code, through the network(s), network link 47 and communication interface 46. In the internet example, a server 52, for example the analysis server 32, can transmit data through the internet 51, ISP 50, local network 48 and communication interface 46.

Figure 4:
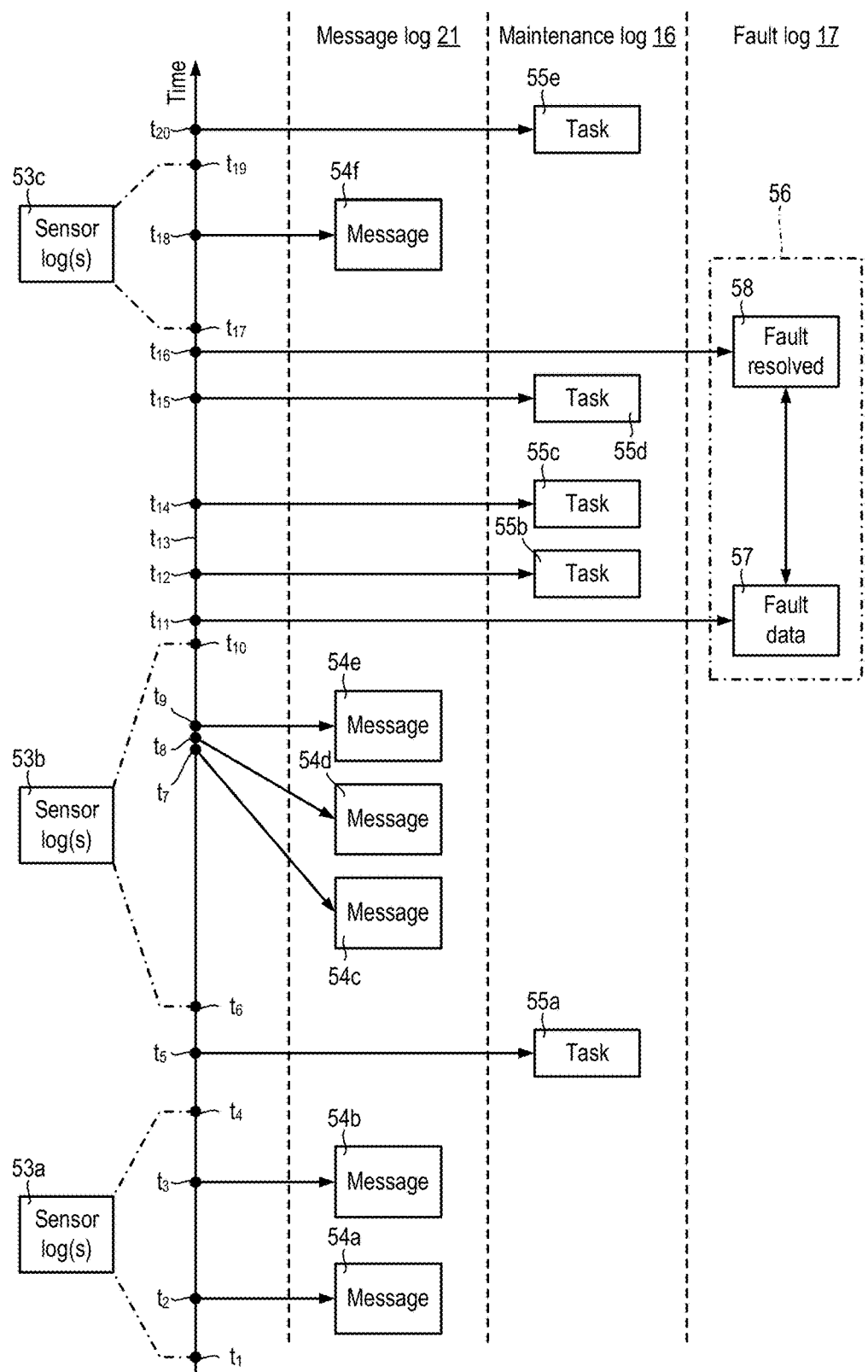
FIG. 4 schematically illustrates a timeline correspondence between data from different data sources.

Referring also to FIG. 4, an example timeline for a machine 15 in the form of a ship 15a will explained with reference to the corresponding message log 21, maintenance log 16, fault log 17 and a number of sensor logs 53.

Each sensor log 53 (e.g., 53a, 53b, 53c) may include a time series of parameter values measured by one or more sensors 19. The sensors 19 may include all of the sensors 19 on the ship 15a, all the sensors 19 associated with one or more subsystems 18, or any other combination of sensors 19. A sensor log 53 may include parameter values measured by a single sensor 19. Parameter values measured by one or more sensors 19 may be measured at equal intervals, or may be measured in response to triggering messages or events. Each sensor 19 may measure parameter values at a rate or interval specific to that sensor 19, to a type of sensor 19 or to a sub-system 18.

A first voyage commences at time $t_1$ and lasts until time $t_4$. The duration of a voyage $t_4$-$t_1$ may vary considerably depending upon the type of ship 15a. In one example, the ship 15a may be a passenger or vehicle ferry which carries out regular, scheduled voyages between a two or more relatively close ports/docks such as, for example, Dover and Calais, Dublin and Liverpool and so forth. In this example, the duration of a voyage $t_4$-$t_1$ may range from less than hour up to several days. Scheduled slots for preventative maintenance may be every day, or every week. Scheduled preventative maintenance may be conducted in one or more of the ports, and it may not be necessary to conduct preventative maintenance during the actual voyage.

In other examples, the ship 15a may be a long distance cargo ship or tanker, and the duration of a voyage $t_4$-$t_1$ may be weeks or months. In this example, preventative maintenance during the voyage cannot be avoided in practice. When the ship 15a is a long distance cargo ship or tanker, preventative maintenance may be split into regular maintenance conducted during voyages, and longer and/or more substantial maintenance slots between voyages. The range and type of maintenance tasks which may be conducted during a voyage may be restricted by the available facilities, consumables, spare parts, operational requirements and so forth.

In the example shown in FIG. 4, the ship 15a is a passenger and/or vehicle ferry which performs regular crossings of a relatively narrow body of water, for example a voyage may take several hours. In the example shown in FIG. 4, regular maintenance is scheduled to occur between voyages. The corresponding parameter values measured by all or a subset of the sensors 19 during the first voyage are stored as a first sensor log 53a. Alternatively, separate first sensor logs 53a may be stored for each sub-system 18 or separate first sensor logs 53a may be stored for each sensor 19. During the first voyage, a first message object 54a is generated by a sub-system 18 and stored in the message log 21, along with the corresponding time t2 and optionally other contextual information such as an identifying number for the voyage. A message object 54 (e.g., 54a, 54b, 54c, 54d, 54e, 54f) may include a message identity (ID) code consisting of letters and/or numbers. The message ID code may correspond to an entry in a look-up table providing further details. For example, a message ID code may take the form A-M-001, in which the letter "A" denotes an origin of the corresponding message object 54 in a first, or "A", sub-system 18, the letter "M" denotes that the message ID code corresponds to a message and should be looked up in a message look-up table, and the numeric code "001" denotes a first entry corresponding to the first sub-system 18 in the message look-up table. The corresponding entry in the message look-up table provides details of the message. The look-up table may be included in the manufacturer information 26, for example in a maintenance manual. Similarly, a message ID code of B-M-023 would identify a message object 54 originating in a second, or "B", sub-system 18 and so forth.

A second message object 54b is generated during the first voyage at time t3 and stored in the message log 21. Message object 54 contents may correspond to, for example, warnings and/or faults. Message object 54 contents may be determined by looking up message ID codes in a message look-up table. A message object 54 may correspond to the illumination of a warning light on the bridge, or illumination of a warning light elsewhere in or on the ship 15a, for example in the engine room.

A second voyage starts at time t6 and finishes at time $t_{10}$, and corresponding sensor 19 measurements are stored in one or more second sensor logs 53b, in the same way as the first sensor log(s) 53a. Between the first and second voyages, at a time $t_5$, a first maintenance task object 55a is recorded in the maintenance log 16 for the ship 15a. The first maintenance task object 55a may include information such as the time, $t_5$, and a maintenance task identity (ID) code consisting of letters and/or numbers. The maintenance task ID code may correspond to an entry in a look-up table providing further details. For example, a maintenance task ID code may take the form A-T-003, in which the letter "A" denotes a maintenance task carried out on a first, or "A", sub-system 18, the letter "T" denotes that the maintenance task ID code corresponds to a maintenance task and should be looked up in a maintenance task look-up table, and the numeric code "003" denotes a third entry corresponding to the first sub-system 18 in the maintenance task look-up table. The corresponding entry in the maintenance task look-up table provides details of the maintenance task which is carried out. The look-up table may be included in the manufacturer information 26. The first maintenance task object 55a may include further information such as, for example, free-text notes or descriptions of the maintenance task performed, details of any parts replaced, information about the engineer or mechanic responsible for carrying out the maintenance task and so forth. The first maintenance task object 55a is not occasioned by a fault, and corresponds to regular, or preventative, maintenance.

A third voyage is scheduled to start at a time t13. However, the start time of the third voyage is delayed until $t_{17}$ due to a fault object 56 which is registered at a time $t_{11}$, shortly after the end of the second voyage at time $t_{10}$. The fault object 56 may correspond to a fault which is discovered following, for example, inspection by the ship crew or port staff, analysis of the second sensor log 53*b*, or the fault may have been indicated by third to fifth message objects 54*c*, 54*d*, 54*e*, which were recorded in a cluster at times $t_7$, $t_8$ and $t_9$. The fault object 56 is recorded in the fault log 17. The fault object 56 includes fault data 57 indicating the time corresponding to the fault object 56, details about the type of fault, the location of the ship 15*a* when the fault was registered and so forth. The fault data 57 may also include a fault identity (ID) code consisting of letters and/or numbers. The fault ID code may correspond to an entry in a look-up table providing further details. For example, a fault ID code may take the form C-F-012, in which the letter "C" denotes a fault arising in a third, or "C", sub-system 18, the letter "F" denotes that the fault ID code corresponds to a fault type and should be looked up in a fault type look-up table, and the numeric code "012" denotes a twelfth entry corresponding to the third sub-system 18 in the fault type look-up table. The corresponding entry in the fault type look-up table provides details of the fault type which has occurred. The fault type look-up table may be included in the manufacturer information 26.

Sometimes a fault corresponding to a fault object 56 may be readily rectified. On other occasions, the root cause of a fault corresponding to a fault object 56 in a ship 15*a*, or a fault in another machine 15, may be difficult to determine. Consequently, an engineer or mechanic may conduct one or more maintenance tasks which fail to resolve the fault. For example, both the second and third maintenance tasks objects 55*b*, 55*c*, started at times $t_{12}$ and $t_{14}$ respectively, both corresponding to maintenance tasks which failed to resolve the fault corresponding to the fault object 56. The fourth maintenance task object 55*d*, started at time $t_{15}$, corresponds to a maintenance task which did resolve the fault corresponding to the fault object 56. When the fault corresponding to the fault object 56 is verified to have been solved, fault resolution data 58 is added to the fault object 56 in the fault log 17. The fault resolution data 58 is linked to the fault data 57. The fault resolution data 58 may include information such as the end time of fault, for example $t_{16}$, and the maintenance task object 55*d* corresponding to the maintenance task which resolved the fault corresponding to the fault object 56.

Once the fault corresponding to the fault object 56 is resolved, the delayed third voyage starts at a time $t_{17}$ and ends at a time $t_{19}$. A sixth message object 54*f* is generated during the third voyage, at time $t_{18}$, but the sixth message object 54*f* does not indicate a new fault or a recurrence of the earlier fault corresponding to fault object 56. Regular or preventative maintenance, in the form of a maintenance task detailed by a fifth maintenance task object 55*e*, is conducted after the third voyage at a time $t_{20}$.

It will be appreciated that the sequence of events described in relation to FIG. 4 is for illustrative purposes only, and that the contents of the present specification may be applied to other sequences of events. For example, in the case of a ship 15*a* which a long distance cargo ship or tanker, voyages may last for weeks or even months, and so sensor logs 53 corresponding to the entire voyage may be inappropriate. Instead, sensor logs 53 for a ship 15*a* which a long distance cargo ship or tanker may be analysed according to shorter time periods, for example, daily, hourly or substantially in real time. Furthermore, in the case of a ship 15*a* which a long distance cargo ship or tanker, maintenance tasks 55 corresponding to preventative maintenance and/or fault resolution may also be conducted during a voyage.

Message logs 21 may be populated in real time, i.e. message objects 54 generated by a machine 15 such as a ship 15*a* may be stored to a corresponding message log 21 at the same time, or shortly after, each message object 54 is generated. Maintenance logs 16 and fault logs 17 may be updated after the relevant events, for example, by filling in an electronic document or by scanning a paper document and so forth.

Statistical metrics may be derived from the parameter values measured by sensors 19. For example, if a parameter value does not vary substantially over time, simple time series statistics may be applied to derive a mean value, a standard deviation, a minimum and a maximum value for each type of parameter value included in a sensor log 53. Average, or baseline, values may be obtained by aggregating a large number of sensor logs 53 corresponding to a number of different machines 15 and different operations of the machines 15. For example, when the machines 15 are ships 15*a*, each operation may correspond to a different voyage, and when the machines 15 take form of construction machinery 15*b* (FIG. 11) each operation may correspond to a different journey, a work order, a lease period, or a fixed period of time such as one working day. Deviations of measured parameter values from the average values may be used as statistical metrics for analysis by the data fusion system 1.

Figure 5:
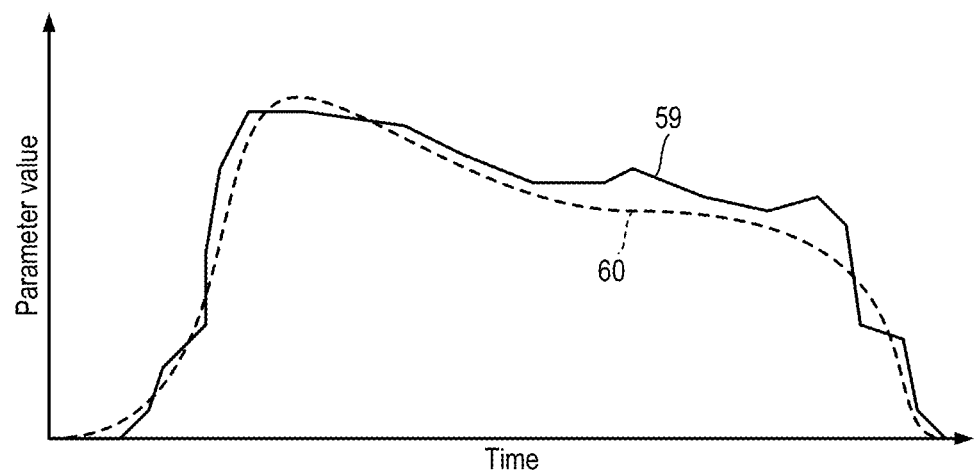
FIGS. 5 and 6 illustrate determining statistical metrics from measured parameter values.
Figure 11:
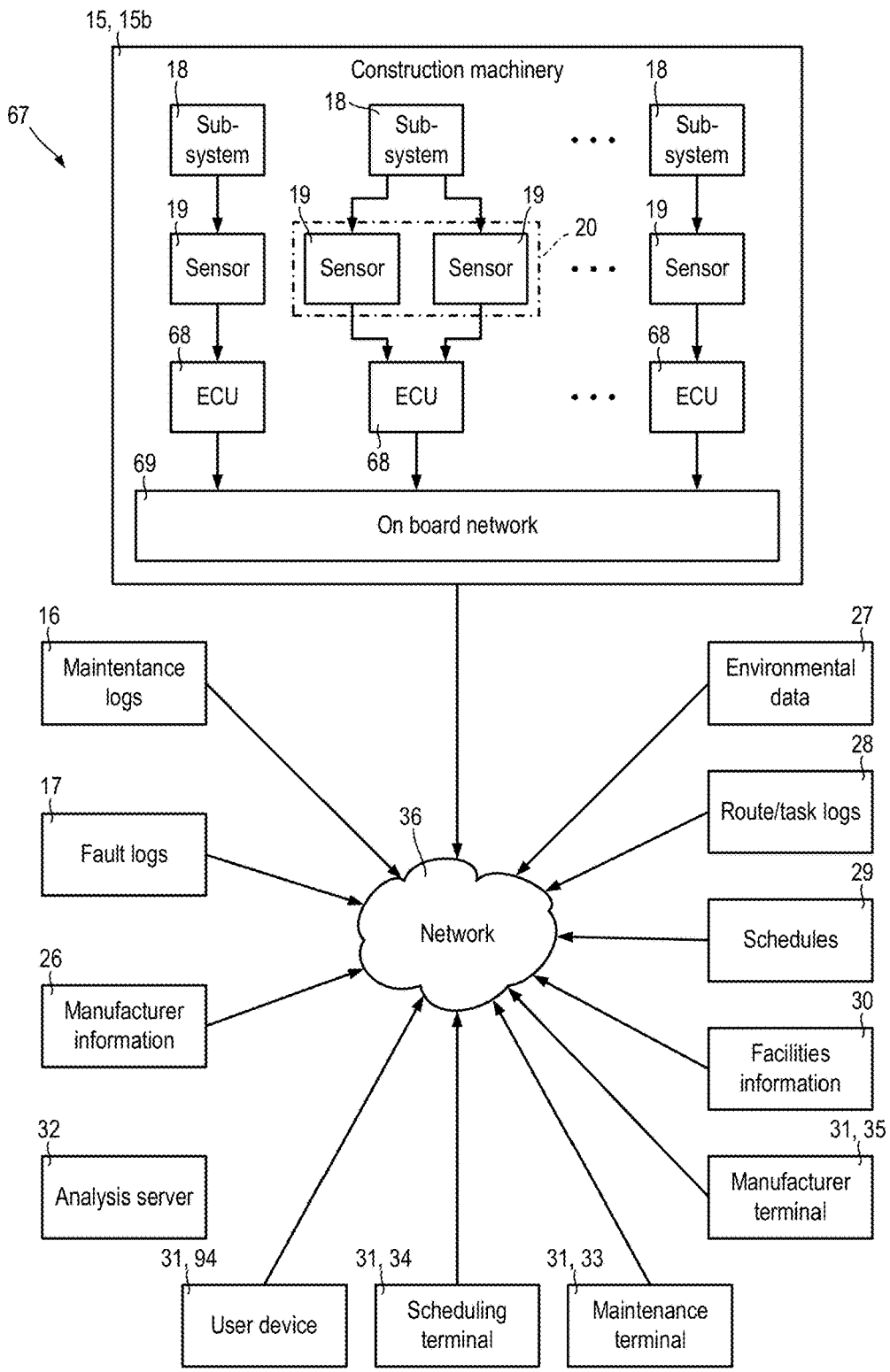
FIG. 11 is a block diagram of a second exemplary system according to embodiments of this specification for analysing and/or modelling a machine.

Referring also to FIG. 5, the values of some parameters measured by sensors 19 will vary with time, for example, over the course of a voyage when the machine 15 is a ship 15*a* or throughout a working day of construction machinery 15*b* (FIG. 11). The parameter values may be plotted against time as a parameter curve 59. By aggregating a large number of sensor logs 53 corresponding to a number of different machines 15 and different operations, a mean value, a standard deviation, a minimum and a maximum value of the parameter may be determined as a function of time. The averaged parameter values may be plotted against time as an average parameter curve 60. Suitable statistical metrics may be calculated such as, for example, the mean and standard deviation of a difference between the parameter curve 59 and the average parameter curve 60. Minimum and maximum differences may also be used as statistical metrics. The same approach may be used to determine statistical metrics based on a difference between first and second parameter curves stored in first and second sensor logs 53. Average parameter curves 60 (and related average statistical metrics) may be updated to take account of new sensor logs 53 by re-calculating average parameter curves 60 (and related average statistical metrics) according to a schedule, for example, daily or weekly. Alternatively, if sensor logs 53 are extracted from the machines 15 at periodic intervals, then the average parameter curves 60 (and related average statistical metrics) may be re-calculated immediately after new sensor logs 53 have been extracted.

Parameter curves 59 need not be plotted against time. Instead, a parameter curve 59 corresponding to a first parameter measured by a first sensor 19 may be plotted against a second parameter measured by a second sensor 19. Statistical metrics and average parameter curves 60 may be calculated in the same way. Analysing a pair of parameters can be useful in diagnosing a developing fault or issue. For example, in a normally functioning diesel engine, the stable operating temperature may vary with the revolutions per minute (RPM) according to a characteristic parameter curve, for example an average parameter curve 59. If a parameter curve 59 significantly deviates from the average parameter curve 60, for example, if the parameter curve 59 shows a faster than expected increase in temperature with RPM, this may indicate a developing fault in coolant levels or in a coolant system.

Figure 6:
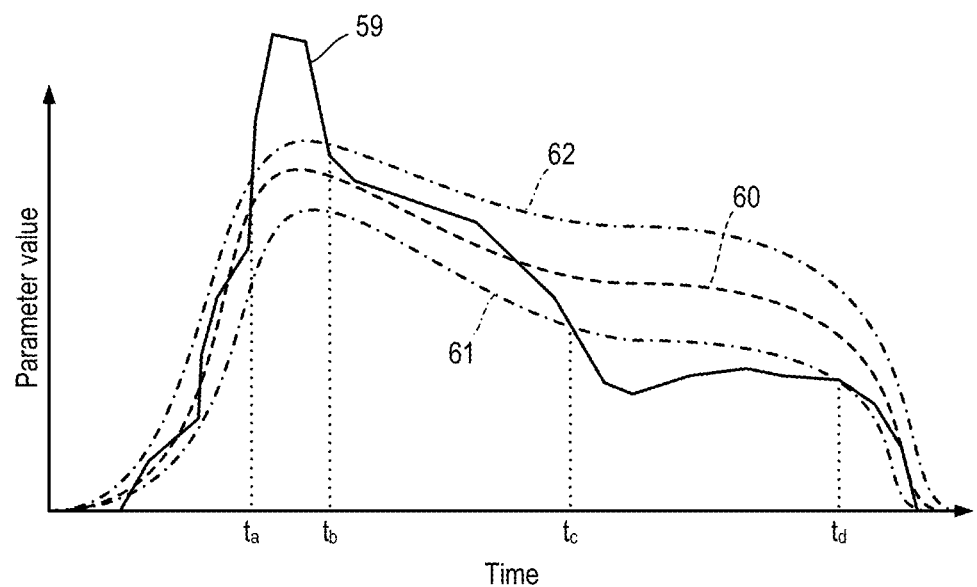

Referring also to FIG. 6, additional statistical metrics may be derived from the sensor logs 53. For example, the number and duration of intervals during which the parameter curve 59 differs from the average parameter curve 60 by more than a threshold amount may be calculated and used as a metric. For example, the number and duration of intervals during which the parameter curve 59 lies below the $25^{th}$ percentile 61 or above the $75^{th}$ percentile 62 may be recorded. In the example shown in FIG. 6, the parameter curve 59 exceeds the $75^{th}$ percentile 62 for a first interval $t_b$-$t_a$ and dips below the $25^{th}$ percentile 61 for a second interval $t_d$-$t_c$. A Schmidt trigger may be used, for example at the $75^{th}$ and $80^{th}$ percentiles, to determine that the parameter curve 59 has exceeded a specified tolerance.

Other thresholds may be used such as, for example, whether the parameter curve 59 deviates from an average parameter curve 60 by more than a multiple of a standard deviation σ. For example, instead of the $75^{th}$ percentile 62, an upper threshold may be the average parameter curve 60 plus 3σ, and instead of the $25^{th}$ percentile 61, a lower threshold may be the average parameter curve 60 minus 3σ. The standard deviation σ may in general be a function of time or of a second parameter.

For machines 15 such as ships 15a or construction machinery 15b (FIG. 11), many parameters will vary with time, but the duration of different sensor logs 53 need not be the same because each sensor log 53 corresponds to a different operation of the same machine 15 or of a different machine 15. This can prevent naïve aggregation of corresponding parameter values belonging to first and second sensor logs 53a, 53b. For example, one working day for construction machinery 15b (FIG. 11) will vary dramatically from a subsequent working day because construction machinery 15b may be used to perform slightly different tasks and the duration and loading of each task may also vary from day to day. Sensors 19 recording parameters of a machine 15 may record datasets corresponding to two or more tasks or occasions which differ to the extent that direct comparison is difficult or meaningless. Such difficulties may be overcome by applying a dynamic time warping algorithm to the sensor logs 53.

Figure 7:
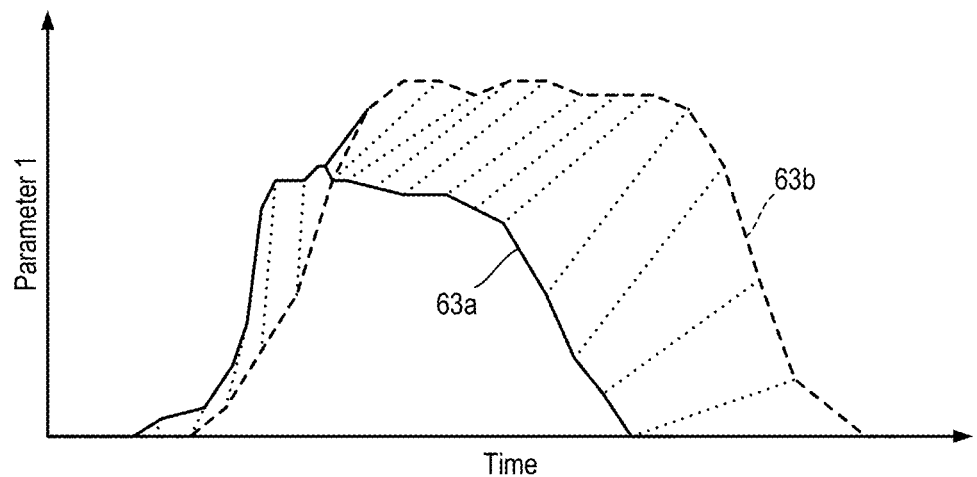
FIGS. 7 and 8 illustrate application of dynamic time warping to allow comparison between first and second curves of a first parameter.
Figure 8:
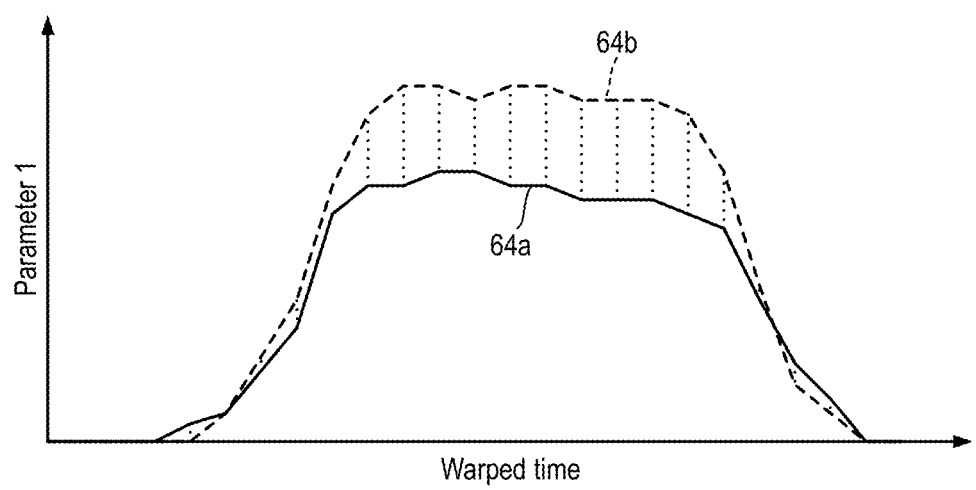

Referring also to FIGS. 7 and 8, first and second curves 63a, 63b of a first parameter are not directly comparable because they have differing lengths. The first and second curves 63a, 63b correspond to first and second sensor logs 53a, 53b respectively. However, a dynamic time warping algorithm may be used to distort the relative time-bases so that first and second warped curves 64a, 64b of the first parameter may be compared. The first parameter may be a parameter having a well understood meaning, such as velocity of a ship 15a, or the velocity and/or engine revolutions per minute (RPM) of construction machinery 15b (FIG. 11). Suitable first parameters may often correspond to the external state of a machine 15, for example, to ambient conditions or to a task which the machine 15 is performing.

Figure 9:
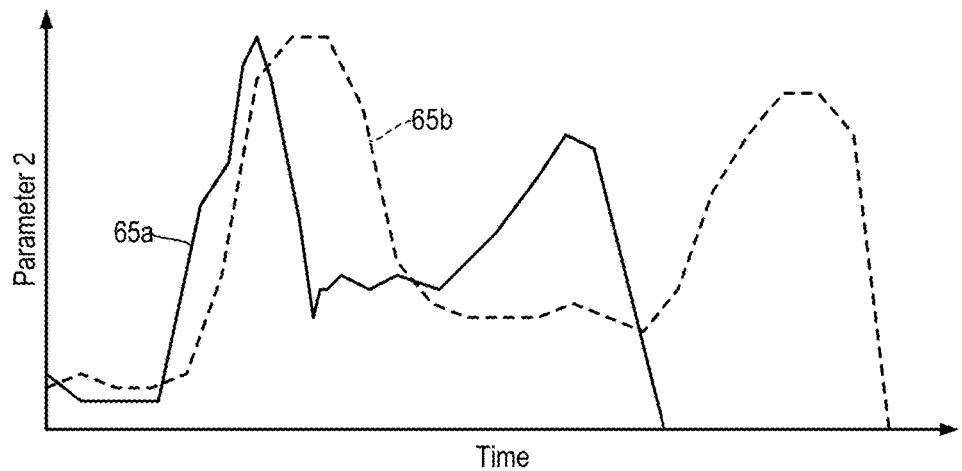
FIGS. 9 and 10 illustrate dynamic time warping of first and second curves of a second parameter based on the dynamic time warping of curves of the first parameter as shown in FIGS. 7 and 8.
Figure 10:
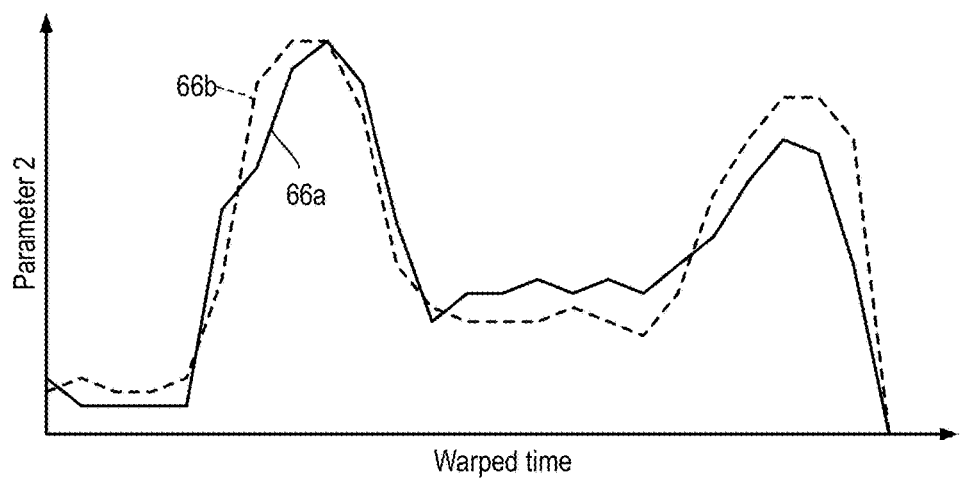

Referring also to FIGS. 9 and 10, first and second curves 65a, 65b of a second parameter may be less well understood or simply less suited to feature extraction. Such second parameters may relate more directly to the internal functioning or internal status of the machine 15. For example, when the machine 15 is a ship 15a, the second parameter may be a temperature of part of a gas turbine engine or a marine diesel engine. As another example, when the machine 15 is construction machinery 15b (FIG. 11), the second parameter may be the pressure of a pneumatic or hydraulic actuation system. Parameters relating to the internal functioning or internal status of the machine 15 may have less predictable or less regular features, which can complicate or prevent the direct application of a dynamic time-warping algorithm, which may lead to erroneous outputs. This issue can be avoided by generating warped curves 66a, 66b of the second parameter based on a warped time-frame established using the curves 63a, 63b of the first parameter. For example, if the machine 15 is a ship 15a or construction machinery 15b, parameters such as engine temperatures may be warped using a time-frame warping established based on parameters such as velocity or engine RPM of the ship 15a or construction machinery 15b.

By using an initial parameter curve as a reference, a large number of sensor logs 53 corresponding to a large number of different machines 15 and operations may be warped, then aggregated to obtain a mean value, a standard deviation, a minimum and a maximum value of each parameter to be determined for the purpose of calculating statistical metrics. Similarly, a large number of sensor logs 53 corresponding to a large number of different machines 15 and operations may be warped, then aggregated to obtain warped average parameter curves.

Log metrics may be determined using the computer readable logs corresponding to each machine 15. For example, when the machine 15 is a ship 15a, metrics may be determined based on the maintenance log 16, fault log 17, message log 21, crew log 22 and bridge log 23 corresponding to each ship 15a, as well as any environmental data 27, route/task logs 28 and so forth. For example, keyword searching may be used to establish frequencies of occurrence of particular words or phrases during one or more time intervals. Additionally or alternatively, when the message objects 54 include message ID codes, the maintenance task objects 55 include maintenance task ID codes and/or the fault objects 56 include fault ID codes, log metrics may be determined in the form of frequencies of occurrence of each message ID code, maintenance task ID code and/or fault ID code during one or more time intervals. When maintenance task objects 55 include a part number or part numbers corresponding to parts which have been replaced/replaced, such part number or part numbers may be extracted in addition to any maintenance task ID code or codes.

Additionally, ontology 5 may include semantic rules allowing natural language processing of computer readable logs, such as the maintenance logs 16, fault logs 17, message logs 21, crew logs 22, bridge logs 23, environmental data 27, route/task logs 28 and so forth. Natural language processing may enable determination of other log metrics.

It will be appreciated that many different examples of statistical metrics and metrics derived from computer readable logs may be used with the data fusion system 1, depending on the data sources 1 which are used.

Referring also to FIG. 11, a block diagram of a second exemplary system 67 for performing one or more operations for analysing and/or modelling a machine 15 is shown. In the second system 67, the machine 15 is construction machinery 15b and the second system 67 can include one or more construction machines 15b. The second system 67 may be used to help managing a fleet of construction machines 15b which are made available for leasing, or to manage all of the construction vehicles associated with a particular construction project. Construction machinery 15*b* may include vehicles such as, for example, bulldozers, diggers, cranes, tractors, combine harvesters and so forth. Each construction machine 15*b* has a corresponding maintenance log 16 and fault log 17. The maintenance log 16 for a construction machine 15*b* may include information such as dates and locations of maintenance, details of replacement parts, free text notes made by an engineer or mechanic performing a maintenance task and so forth. The fault log 17 for a construction machine 15*b* may include information such as dates and locations of faults, the type of fault, the period of time required to rectify the fault and so forth. The maintenance logs 16 and fault logs 17 are stored in suitable computer readable formats or structures, such as XML files, database tables, and so forth. The maintenance log 16 and fault log 17 corresponding to a construction machine 15*b* may be stored on one or more servers and/or locally on the construction machine 15*b* itself. Maintenance logs 16 and fault logs 17 corresponding to a number of different construction machines 15*b* may be stored in a common database, for example database 7.

A construction machine 15*b* includes a number of sub-systems 18 which may be mechanical systems, electrical systems, computer systems or combinations thereof. Sub-systems 18 of a construction machine 15*b* may be controlled by one or more corresponding electronic control units 68 (ECUs), and the ECUs 68 of a construction machine 15*b* are interconnected for communications by an on-board network 69. Each sub-system 18 may include one or more sensors 19 which monitor corresponding physical parameters of the sub-system 18. One or more sensors 19 associated with a sub-system 18 form a sensor group 20. Examples of sensors 19 include a temperature sensor, a pressure sensor, an electrical current or voltage sensor, a gas concentration sensor, a strain gauge, and so forth. Data from sensors 19 may be stored on the construction machine 15*b* and subsequently transmitted or downloaded from the construction machine 15*b* according to a schedule, for example, upon arrival to a designated "home" location, daily or weekly. Data from some sensors 19 may be transmitted to a server via wireless networks operating at a storage location or operational location of a construction machine 15*b*. Data from some sensors 19 may be transmitted to a server via cellular networks during operation of a construction machine 15*b*. Sub-systems 18 connected via the on-board network 69 typically generate message objects 54 according to protocols which may be proprietary or standardised protocols. Information from a construction machine 15*b* may be extracted via a wireless connection or using a physical data port provided on the construction machine 15*b*.

Figure 12:
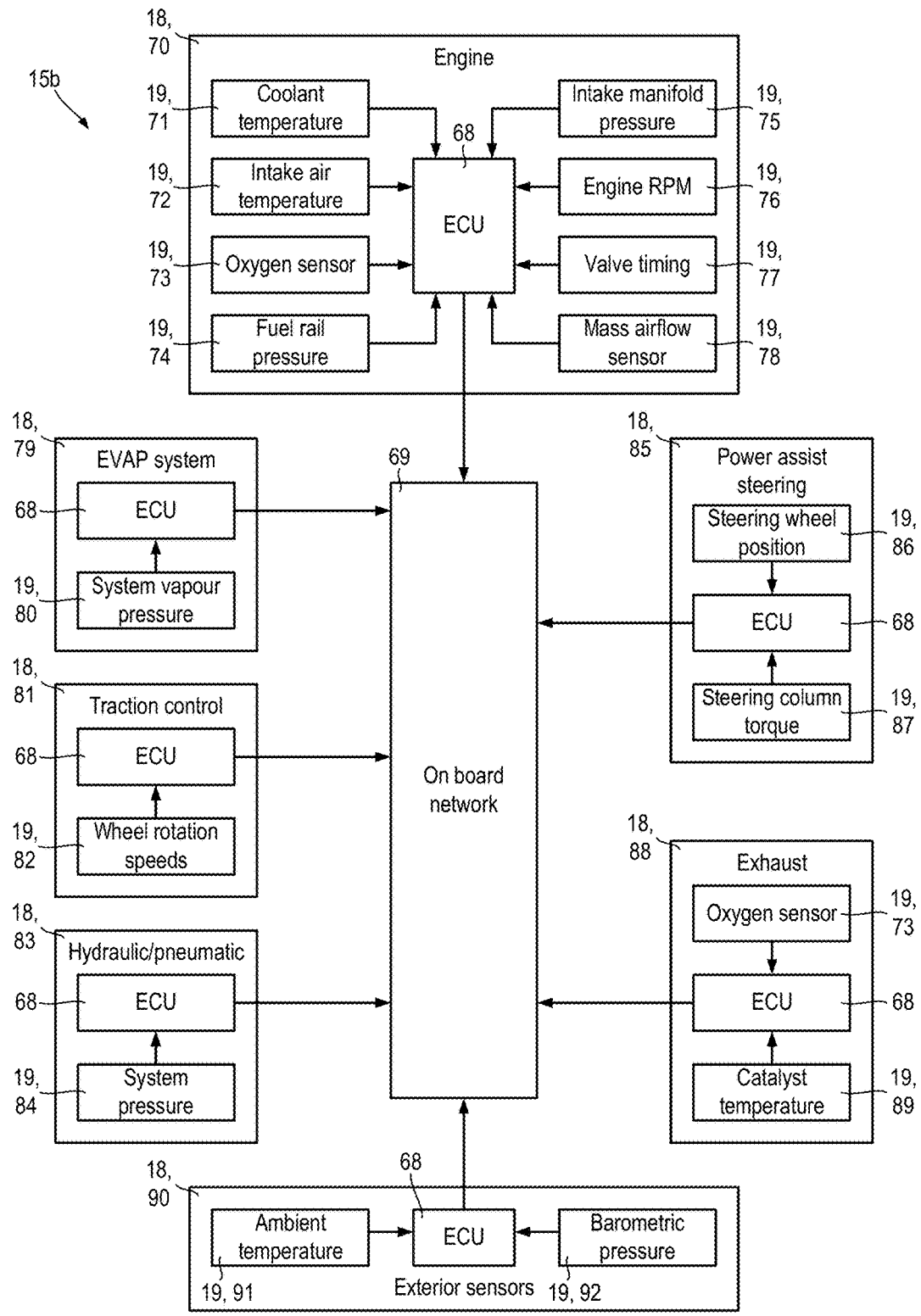
FIG. 12 is a block diagram illustrating sub-systems and sensors for construction machinery.

Referring also to FIG. 12, examples of construction machine 15*b* sub-systems 18 and associated sensors 19 are shown.

Many construction machines 15*b* include a diesel engine 70, which may include a large number of sensors 19 for use in regular operation, self-diagnostics, maintenance and/or repair. For example, a construction machine 15*b* diesel engine 70 may include, amongst other sensors 19, a coolant temperature sensor 71, an intake air sensor 72, one or more oxygen sensors 73 to monitor combustion efficiency, a fuel rail pressure sensor 74, an intake manifold gas pressure sensor 75, and engine RPM sensor 76, one or more valve timing sensors 77, a mass airflow sensor 78 and so forth.

Construction machines 15*b* may include an evaporative emissions control system 79 (EVAP system) including a vapour pressure sensor 80. Some construction machines 15*b* may include a traction control system 81 including wheel rotation speed sensors 82. Some construction machines 15*b* may include a hydraulic or pneumatic actuation system 83 including system pressure sensors 84, valve status sensors, load sensors and so forth, for controlling and monitoring actuation of tools such as a bull dozer scoop. Construction machines 15*b* may include a power assist steering system 85 including steering wheel position sensors 86 and steering column torque sensors 87. Construction machines 15*b* may include an exhaust system 88 including, for example, one or more oxygen concentration sensors 73 and one or more catalyst bed temperature sensors 89. Construction machines 15*b* may include exterior sensing systems 90 including sensors 19 such as, for example, ambient temperature sensors 91 and ambient barometric pressure 92 for determining the environmental conditions in which the construction machine 15*b* is operating.

The construction machine 15*b* may also store message logs 21 and global positioning system (GPS) (or other positioning system) logs 25. The message log 21 corresponding to a construction machine 15*b* may include message objects 54 generated by the ECUs 68, for example, according to OBD protocols. The message objects 54 may include a date and time, an identifier of an originating sub-system 18, and message contents such as, for example, a warning or fault identifier. Message logs 21 and global positioning system (GPS) logs 25 are stored in suitable computer readable formats or structures, such as XML files, database tables and so forth.

The second system 67 may also include manufacturer information 26 including, for example, databases providing information about messages and/or faults, suggested maintenance tasks, and manufacturer recommended tolerances for parameters measured by sensors 19. The second system 67 may also include environmental data 27 such as ambient temperatures, humidity and so forth, as a function of date, time and location. Such information may be relevant to predicting failure of construction machines 15*b* in a variety of ways. For example, a degraded battery system may not become evident to a user until it fails to supply sufficient current for a starter motor in colder ambient conditions. The degradation of the battery system may be detectable in sufficient time to allow replacement, however, whether or not battery replacement is the most critical preventative maintenance task may depend on the expected ambient temperatures. The second system 67 may also include a route/task log 28 corresponding to each construction machine 15*b*. The route/task log 28 for a construction machine 15*b* may include details of the start and end locations, routes traveled, dates and times of each journey, details of tasks assigned to the corresponding construction machine 15*b* and so forth. Route/task logs 28 may provide important contextual information for interpreting construction machine 15*b* sensor 19 data, for example, route information may be matched to elevation data to account for variations in engine power output of a tractor driving up or down a field located on an incline. The second system 67 may also include schedules 29 for the tasks which a fleet including a number of construction machines 15*b* need to be assigned to perform over a forthcoming time period. The second system 67 may also include facilities information 30 such as, for example, a type or class of available facilities at each location where a fleet of construction machines 15*b* operates or may operate. Examples of facilities information 30 may include locations of garages providing repair and/or re-fuelling, locations and availability of spare parts and/or geographical coverage and locations of breakdown recovery services.

The manufacturer information 26, environmental data 27, route/task logs 28, schedules 29 and facilities information 30 may be stored in suitable computer readable formats or structures, such as XML files, database tables, and so forth. The manufacturer information 26, environmental data 27, route logs 28, schedules 29 and facilities information 30 may be stored in one or more servers.

The maintenance logs 16, fault logs 17, sensors 19, message logs 21, GPS logs 25, manufacturer information 26, environmental data 27, route/task logs 28, schedules 29 and facilities information 30 are examples of data sources 2 for the data fusion system 1.

The second system 67 includes one or more analysis terminals 31 in the form of one or more computing systems 37.

The data fusion system 1 may be provided by one or more analysis servers 32 and one or more analysis terminals 31 may connect to the analysis server 32 as clients. Alternatively, each analysis terminal 31 may provide an example of the data fusion system 1. Examples of analysis terminals 31 may provide the same or different functions. For example, different analysis terminals 31 may be able to access different types of data or functions of the analysis server 32. For example, a scheduling terminal 34 may access data relating to risk model 6 outputs, schedules 29 and facilities information 30 to perform risk based scheduling of construction machine 15b tasks. As another example, a manufacturer terminal 35 may be given access to a reduced or redacted selection of data from the data sources 2, in order to allow monitoring and analysis of technical data whilst preserving the integrity of commercially sensitive information. A user device 94 such as a smartphone or tablet computer operated by the construction machine operator may also provide an analysis terminal 31 to enable the operator to receive timely and convenient notification of developing problems. In some examples, all analysis terminals 31 may access the same data and functions.

The analysis terminals 31 and analysis server 32 of the second system 67 communicate with the data sources 2 over a network 36 in the same way as the first system 14.

The second system 14 may include a number of machines 15 in the form of construction machines 15b, and all of the construction machines 15b forming part of the second exemplary system 67 are the same or comparable to one another.

The present specification is not limited to machines 15 in the form of ships 15a or construction machine 15b in the form of vehicles such as, for example, bulldozers, diggers, cranes, tractors, combine harvesters and so forth. The present specification is equally applicable to machines 15 in the form of any other type of vehicle such as, for example, trains and so forth.

The present specification is not limited to vehicular machines 15, and may instead be applied to any type of machine 15 which includes sensors 19. For example, the present specification may be applied to sewage treatment equipment such as a sewage treatment plant. Unscheduled stoppages of a sewage treatment plant can be very expensive in lost time. Therefore, the teachings of the present specification in relation to predicting fault probabilities, risk scores and fault prevention using data-driven selection of preventative maintenance tasks can provide advantages for a sewage treatment plant.

In a sewage treatment plant operating conditions are intended to be relatively stable. The embodiments of the present specification relating to dynamic time warping and incorporation of computer readable logs to provide contextual information can allow the present specification to be particularly useful for applications in which machines 15 are operated in variable conditions and/or for variable tasks. For example, tunnel boring equipment is complex machinery which is operated in a range of different environments and under a range of mechanical loadings. Each location for tunnel boring will have a different geological constitution, so that loading of a boring bit will vary with depth and distance of the bore hole in a different way at each drilling location. Additionally, boring locations can be remote, so that obtaining spare parts may take a long time in the event of an unanticipated failure. Therefore, the teachings of the present specification in relation to context dependent fault prediction and fault prevention using data-driven selection of preventative maintenance tasks can provide advantages for tunnel boring equipment.

System for Preventing Faults

Machines 15 must be regularly maintained. Machines 15 may undergo regular maintenance according to a schedule such as, for example, after every time the machine 15 is used, every day, every week, every month and so forth.

Regular maintenance of a machine 15 includes a mixture of tasks which are performed every maintenance cycle, for example checking and topping off pressures or fluid levels. Regular maintenance of a machine 15 also includes preventative maintenance such as, for example, replacement of parts, purging and cleaning a fluid system before re-filling the system and so forth. The time available for preventative maintenance can be determined on an ad-hoc or "gut instinct" basis, or according to a cycle or schedule of predetermined maintenance tasks.

Regular maintenance of machines may fall into a number of different categories. For example, for a machine in the form of a ship, some maintenance tasks may be carried out in service, i.e. whilst the ship is at sea. However, other maintenance tasks may require port facilities, or other specialist equipment and/or personnel, for example divers. Still further maintenance tasks for a ship may require that the ship is in drydock, i.e. removed from the water.

Figure 13:
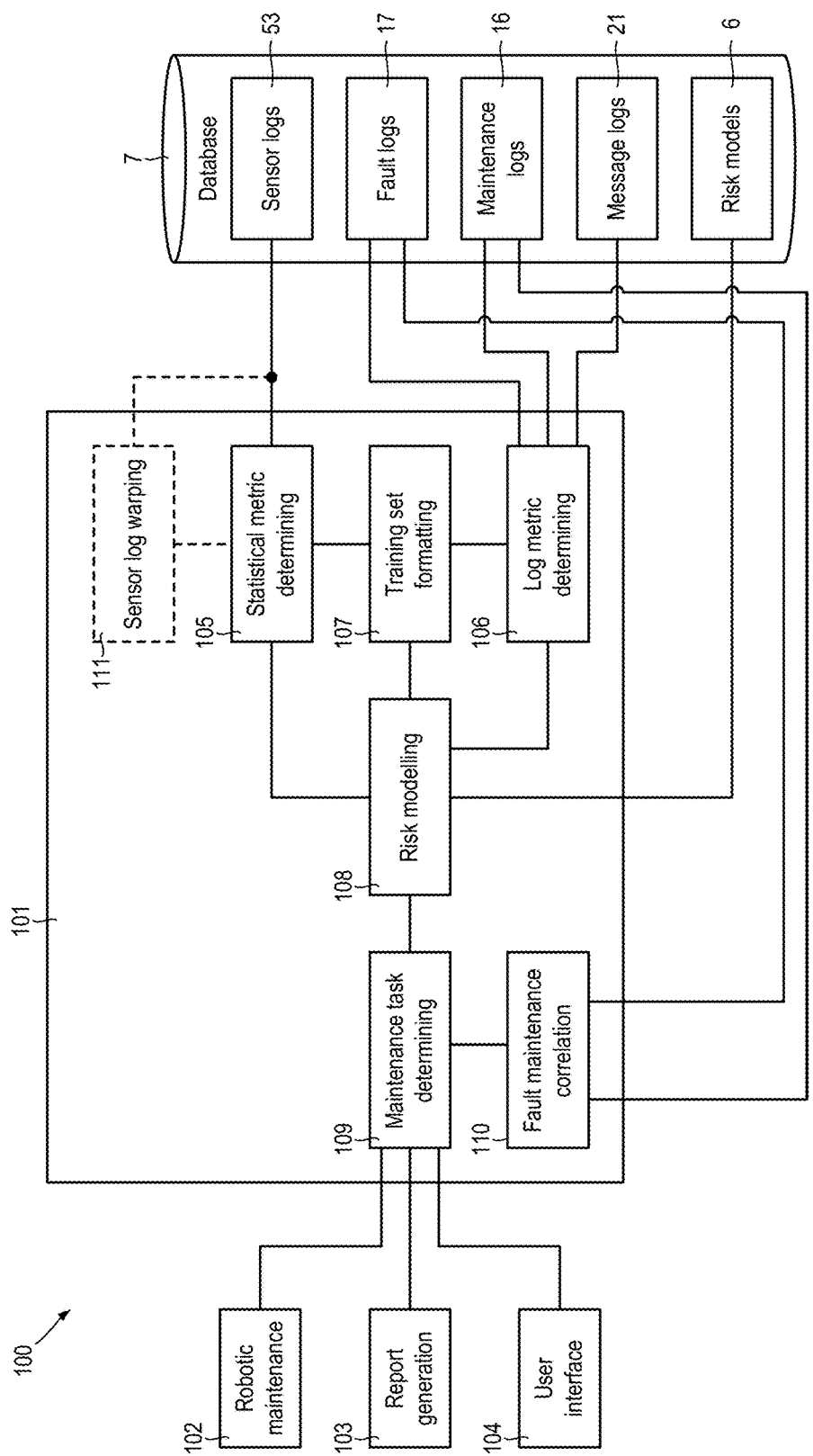
FIG. 13 is a block diagram of an apparatus according to embodiments of this specification for modelling machine fault probabilities or risk scores.

Referring also to FIG. 13, a system 100 for preventing faults may be used to increase the effectiveness of preventative maintenance by determining the sub-system 18 to be prioritised for preventative maintenance and/or the maintenance to be performed based on technical data of the history and operation of a machine 15. The system 100 for preventing faults is one example of a system implemented in accordance with the data fusion system 1.

The system for preventing faults 100 includes a database 7, an apparatus for modelling machines 101 and a robotic maintenance system 102. The system 100 may optionally include a report generation module 103 and/or a user interface 104.

The database 7 includes a number of sensor logs 53 corresponding to one or more machines 15 and one or more operations of each machine 15. The machines 15 are of the same or corresponding types and each machine 15 includes the same or corresponding sub-systems 18 and sensors 19. Each sensor log 53 includes measured parameters measured by one or more sensors 19. For example, if machines 15 take the form of construction machines including diesel engines 15b, then the sensor logs 53 may include measurements of parameters such as, for example, engine temperature, fuel injector pressure, exhaust catalyst temperature, exhaust oxygen concentration and so forth. In another example, if machines 15 take the form of ships 15*a*, sensor logs 53 may include measured values of parameters such as, for example, speed, engine temperature, cabin and/or cargo area temperature, bilge level, torque on the propeller shafts and so forth.

The database 7 also includes a fault log 17 corresponding to each machine 15. Each fault log 17 is a computer readable log which includes a number of fault objects 56, and each fault object includes fault data 57 specifying a time and a type of a fault (for example a fault ID code), and fault resolution data 58 specifying an end time or duration of the fault and, optionally, a maintenance task object 55 corresponding to a maintenance task which resolved the fault.

The database 7 also includes additional computer readable logs corresponding to each machine 15. The computer readable logs for each machine 15 include a maintenance log 16. Each maintenance log 16 includes a number of maintenance task objects 55, each maintenance task object 55 specifying a time, a maintenance task type (for example using a maintenance task ID code) and, optionally, the duration of the maintenance task. Maintenance task objects 55 may also include details of locations at which a maintenance task was performed, details of replacement parts used and free text notes made by an engineer or mechanic performing the maintenance task.

The computer readable logs stored in the database 7 may also include a message log 21 corresponding to each machine 15. The message logs 21 corresponding to each machine 15 may include message objects 54 generated by controllers, processors or similar devices which are integrated into the various sub-systems 18 of the machine 15. Each message object 54 may include a date and time, an identifier of the originating sub-system 18 and message contents such as, for example, a message ID code. A message object 54 may include content such as a fault ID code when the message is reporting a fault.

The computer readable logs stored in the database 7 may include additional data sources 2 not shown in FIG. 13 such as, for example, the crew logs 22, cockpit logs 23, manufacturer information 26, weather data 27, route logs 28, schedules 29 and facilities information 30.

The database 7 also includes data models 3 in the form of risk models 6 for calculating a fault probability or risk score for a machine 15, or a sub-system 18 of a machine 15, during an interval of time. Risk models 6 are machine learning models or weighted average models, and methods of generating and using risk models 6 is further described hereinafter. The database 7 may include a risk model 6 corresponding to the machines 15, or may include one or more risk models 6 corresponding to machine 15 sub-systems 18.

The database 7 contents are stored in suitable computer readable formats or structures, such as XML files, database tables, and so forth. The database 7 may be locally stored on one or more storage devices. Alternatively, the database may be stored on one or more servers in networked communication with the apparatus 101 for modelling machines 15.

The apparatus 101 for modelling machines 15 includes a statistical metric determining module 105, a log metric determining module 106, a training set formatting module 107, a risk modelling module 108, a maintenance task determining module 109 and a fault maintenance correlation module 110. Optionally, the apparatus 101 for modelling machines 15 includes a sensor log warping module 111. The apparatus 101 for modelling machines 15 is an example of an analysis terminal 31 or analysis server 32. The apparatus 101 for modelling machines 15 may be provided by a suitably programmed computer system such as the computer system 37.

The statistical metric determining module 105 accesses sensor logs 53 stored in the database 7 and processes them to determine statistical metrics. For example, referring again to FIG. 5, the statistical metric determining module 105 may determine the mean and standard deviation of a difference between a parameter curve corresponding to a particular sensor log 53 (for example parameter curve 59) and an average parameter curve (for example average parameter curve 60) determined by aggregating a large number of sensor logs 53 across a number of different machines 15 and/or operations of the machines. Minimum and maximum differences may also be used as statistical metrics. An average parameter curve corresponding to a particular sensor 19, or to each particular sensor 19, may be determined in advance and stored separately in the database 7. Alternatively, average parameter curves may be determined based on a number of sensor logs 53 and used to determine statistical metrics corresponding to each sensor log 53. Referring again to FIG. 6, additional statistical metrics may be derived from the sensor logs 53. For example, the number and duration of intervals during which a parameter curve (for example parameter curve 59) differs from the average parameter curve (for example average parameter curve 60) by more than a threshold amount may be calculated and used as a metric.

The statistical metric determining module 105 may determine statistical metrics based on warped sensor logs. For example, referring again to FIGS. 7 to 10, the sensor log warping module 111 may retrieve sensor logs 53 and generate warped sensor logs (for example warped curves 56) as described hereinbefore with reference to FIGS. 7 to 10. The statistical metric determining module 105 may determine statistical metrics based on the warped sensor logs in the same was as for sensor logs 53. The warped sensor logs may be determined in advance and stored separately in the database 7. Warped sensor logs may be retrieved and processed by the statistical metric determining module 105 in the same way as sensor logs 53. Average warped parameter curves may be determined in advance in the same way as average parameter curves, and may be stored separately in the database 7 for retrieval by the statistical metric determining module 105. Alternatively, a number of warped sensor logs may be determined and passed to the statistical metric determining module 105 for determination of an average warped parameter curve and determination of statistical metrics corresponding to each warped sensor log.

The log metric determining module 106 accesses the computer readable logs 16, 17, 21 and determines log metrics based on the maintenance log 16, fault log 17 and optionally message log 21 corresponding to each machine. In some examples, log metrics are also determined based on additional computer readable logs such as, for example, crew logs 22, bridge logs 23, environmental data 27, route/task logs 28 and so forth. Where the computer readable logs 16, 17, 21 include free-text information, the log metric determining module 106 may perform keyword searching to establish frequencies of occurrence of particular words or phrases during one or more time intervals. The log metric determining module 106 may include a database including synonyms for keywords and/or common misspellings. The log metric determining module 106 may employ natural language processing to determine patterns in free-text information. Additionally or alternatively, message objects 54, maintenance task objects 55 and fault objects 56 may include ID codes which identify maintenance task types and/or fault types, and the frequencies of occurrence of the ID codes during one of more time intervals may be used as log metrics.

The training set formatting module 107 receives statistical metrics and log metrics and configures them to generate a training set for use by the risk modelling module 108 to generate a corresponding risk model 6. The statistical metrics, together with the log metrics derived from the maintenance logs 16 and message logs 21, may provide test inputs for a machine learning model or may be used as the basis for determining probabilities and respective weights for a weighted average model. The log metrics derived from the fault logs 17 provide corresponding test outputs for a machine learning model or may be used as the basis for determining probabilities and respective weights for a weighted average model. The configuration of the training set will depend on the type of risk model which the risk modelling module 108 generates.

The risk modelling module 108 receives the training set and generates a risk model 6 in dependence on the training set. The risk model 6 may be a machine learning model or the risk model 6 may be a weighted average model. A machine learning risk model 6 may be used to estimate the probability of faults occurring in a machine 15, a sub-system 18 of the machine, or in a group of sub-systems 18. Weighted average risk models 6 fall into two main categories. A first type of weighted average risk model 6 uses weights in the form of probabilities of a fault developing to calculate an risk scores in the form of estimated probabilities of a corresponding fault type occurring in an associated machine 15, sub-system 18 of the machine, or a group of sub-systems 18. A second type of weighted average risk model 6 uses weights in the form of importance metrics to calculate risk scores which are indicative of the relative seriousness of corresponding fault types which may be developing in an associated machine 15, sub-system 18 of the machine, or a group of sub-systems 18. Further details of machine learning models and weighted average models follow hereinafter.

Once a risk model 6 has been generated by the risk modelling module 108, it is passed to the database 7 for storage. A stored risk model 6 may be used to estimate the probabilities or risk scores of a number of fault types (for example each fault ID code) occurring in a machine 15, a sub-system 18 of the machine 15 or a group of sub-systems 18 within a future interval, in dependence upon the recent sensor logs 53 for that machine, as well as the corresponding maintenance log 16 and message log 21.

In some examples, log metrics derived from the fault logs 17 may also be used as input data for generating the risk model 6. A prior fault in a first sub-system 18a has the potential to be predictive of a future fault in a related, second sub-system 18b. In some examples, the training set used generate a risk model 6 includes additional log metrics derived from computer readable logs such as, for example crew logs 22, bridge logs 23, environmental data 27, route/task logs 28 and so forth.

The system 100 may be used with different types of machine 15, for example, each machine 15 may be an independent machine or each machine may form part of a large, complex machine. A single risk model 6 may be generated for a machine 15 overall, or a separate risk model 6 may be generated for each sub-system 18 of the machine 15. When a risk model 6 is generated for a sub-system 18, the training set need not be limited to sensor logs 53 corresponding to sensors 19 associated with that sub-system 18. The training set may also include test input data associated with related subsystems 18, or for the machine 15 overall. However, the test output included in the training set may be restricted to fault objects 56 which correspond to the sub-system 18 which is the subject of the risk model 6.

The maintenance task determining module 109 may control the risk modelling module 108 to retrieve a risk model 6 corresponding to a machine 15 or a sub-system 18 of the machine, to obtain statistical metrics determined based on sensor logs 53 corresponding to a preceding interval and to obtain log metrics determined based on computer readable logs 16, 17, 21 corresponding to the preceding interval. The risk modelling module 108, under the control of the maintenance task determining module 109, determines probabilities or risk scores for each fault type (for example for each fault ID code) which is predicted by the risk model 6. The fault types for which probabilities or risk scores are generated may depend on the fault types which were included in the original training set for the risk model 6.

When the risk modelling module 108 determines probabilities or risk scores in the form of probabilities (machine learning models or weighted average models of the first type), the maintenance task determining module 109 determines a fault metric based on the probabilities for each fault type (for example, for each fault ID code). The fault metric for each fault type may be the probability of that fault type occurring. Alternatively, the maintenance task determining module 109 may control the fault maintenance correlation module 110 to access the fault logs 17 and to determine, for each relevant fault type, an average fault duration based on fault objects 56 having that fault type. The maintenance task determining module 109 may calculate the fault metric for each fault type as a product of the fault probability and the average fault duration, i.e. the expectation value of delay for each fault type.

Alternatively, the maintenance task determining module 109 may calculate the fault metric for each fault type as a product of the fault probability and a "severity score", which is a user determinable value reflecting the importance of the associated sub-system 18. For example, when the machine 15 is a ship 15a, sub-systems 18 relating to the engines may have a relatively high severity score because a drifting ship may run around or become swamped in rough seas. By contrast, a sub-system controlling emergency lighting in the crew cabins may have a lower severity score. In other words, the fault metric may be determined based on the consequences of a fault.

When the risk modelling module 108 determines risk scores which are indicative of the relative seriousness of potential faults (weighted average models of the second type), the risk scores may be used as fault metrics without further processing.

The maintenance task determining module 109 ranks each predicted fault type according to the values of the fault metric, and selects a priority fault type based on the ranking. The maintenance task determining module 109 controls the fault maintenance correlation module 110 to determine a priority maintenance task associated with the priority fault. The fault maintenance correlation module 110 analyses the fault logs and maintenance logs to determine the maintenance task which has the highest probability of resolving (i.e. averting) the priority fault. For example, on prior occasions on which a fault type corresponding to a fault ID code A-F-004 has occurred, the fault may have been resolved by a maintenance task corresponding to a maintenance task ID code (i.e. a maintenance task type) of A-T-024 in 65% of previous occurrences of the same fault, by a maintenance task corresponding to a maintenance task ID code (i.e. a maintenance task type) of A-T-005 in 20% of previous occurrences of the same fault, and by a maintenance task corresponding to a maintenance task ID code (i.e. a maintenance task type) of A-T-042 in 15% of previous occurrences of the same fault. In this example, the maintenance task corresponding to maintenance task ID code (i.e. maintenance task type) A-T-024 would be selected as the priority maintenance task.

The maintenance task determining module 109 outputs the priority maintenance task to a robotic maintenance system 102 which carries out the selected priority maintenance task.

Alternatively, the maintenance task determining module 109 may output the priority maintenance task to the report generation module 103, which prepares and outputs a physical report or work order to direct an engineer or mechanic to perform the priority maintenance task.

In other examples, the maintenance task determining module 109 may output the priority maintenance task to the user interface 104. The maintenance task determining module 109 may also output further information to the user interface such as, for example, a list of fault types ranked according to the corresponding fault metric values, relative probabilities of different maintenance tasks resolving the priority fault and so forth.

In this way, decision making about preventative maintenance may be placed on a quantitative footing. The output of the risk model 6 is a set of probabilities or risk scores for various types of technical fault which may develop in a machine 15, a subsystem 18 of the machine 15 or a group of sub-systems 18. These probabilities or risk scores are determined through processing of technical data such as sensor 19 measurements and computer readable logs 16, 17, 21. Instead of trying to predict precisely when a machine 15 will fail, which may be impractical in many situations, the system 100 instead aims to determine a maintenance task which will provide the greatest improvement in a fault metric, for example, the probability of a fault occurring or the expectation value of delay durations resulting from faults.

In an alternative example, the maintenance task determining module 109 may determine the fault metric and priority maintenance task by repeated application of a machine learning risk model 6. For example, the maintenance task determining module 109 may control the risk modelling module 108 to generate a probability corresponding to each fault type (for example each fault ID code) using a machine learning risk model 6. A baseline expectation delay may be calculated by summing, for each fault type, the predicted probability and the average associated fault duration. The maintenance task determining module 109 may control the fault maintenance correlation module 110 to analyse the maintenance and fault logs 16, 17 and compile a list of all correlated maintenance tasks. A correlated maintenance task (for example corresponding to a maintenance task type or ID code) in this context is one which has previously been performed in connection with the predicted fault type or fault types. For each correlated maintenance task, the maintenance task determining module 109 may control the risk modelling module 108 to repeat the probability calculations using the machine learning risk model 6 and a modified maintenance log. The modified maintenance log is formed by taking the maintenance log 16 for the machine 15 being modelled, and adding an additional maintenance task object 55 corresponding to the correlated maintenance task. In this way, the probability of each fault type may be calculated on the assumption that the correlated maintenance task is carried out.

For each correlated maintenance task, the maintenance task determining module 109 may re-determine the fault probabilities, and also determine a maintenance task metric in the form of a change in the overall expectation delay, i.e. the sum of the predicted probabilities and the average associate durations for each fault type. The priority maintenance task may be selected as the correlated maintenance task which gives rise to the largest reduction in the expectation delay.

Further features of the apparatus 101 for modelling machines 15 shall become apparent from the description of methods hereinafter.

Machine Learning Risk Model

The risk model 6 may be a machine learning model, for example, a random forest model. Alternatively, the risk model 6 may be any other suitable type of machine learning model such as, for example, a kernel random forest, an artificial neural network, a Bayesian network, a hidden Markov model and so forth. The risk modelling module 108 iterates the machine learning risk model 6 so as to minimise a difference between predicted probabilities of each fault type developing in the machine 15 (or a sub-system 18 or group of sub-systems 18) and the observed probabilities of each fault type. Fault types may be identified using the fault ID codes.

The risk model 6 receives as input the statistical metrics and log metrics derived from the maintenance logs 16 and message logs 21. The risk model 6 receives inputs corresponding to a preceding interval such as, for example, one day, three days, one week, a month and so forth. The probabilities of each fault type are calculated for a future interval, and the observed probabilities against which the predictions are compared are based on log metrics derived from the fault logs 17. The future interval may be, for example, a day, two days, three days, a week, two weeks, a month and so forth.

Weighted Average Risk Model

A first type weighted average risk model 6 may be based on historical probabilities that a fault develops within a certain period following one or more potential fault criteria being satisfied. A second type of weighted average risk model 6 may be based on the relative seriousness of faults developing in sub-systems 18 which are associated with one or more potential fault criteria being satisfied.

Figure 14:
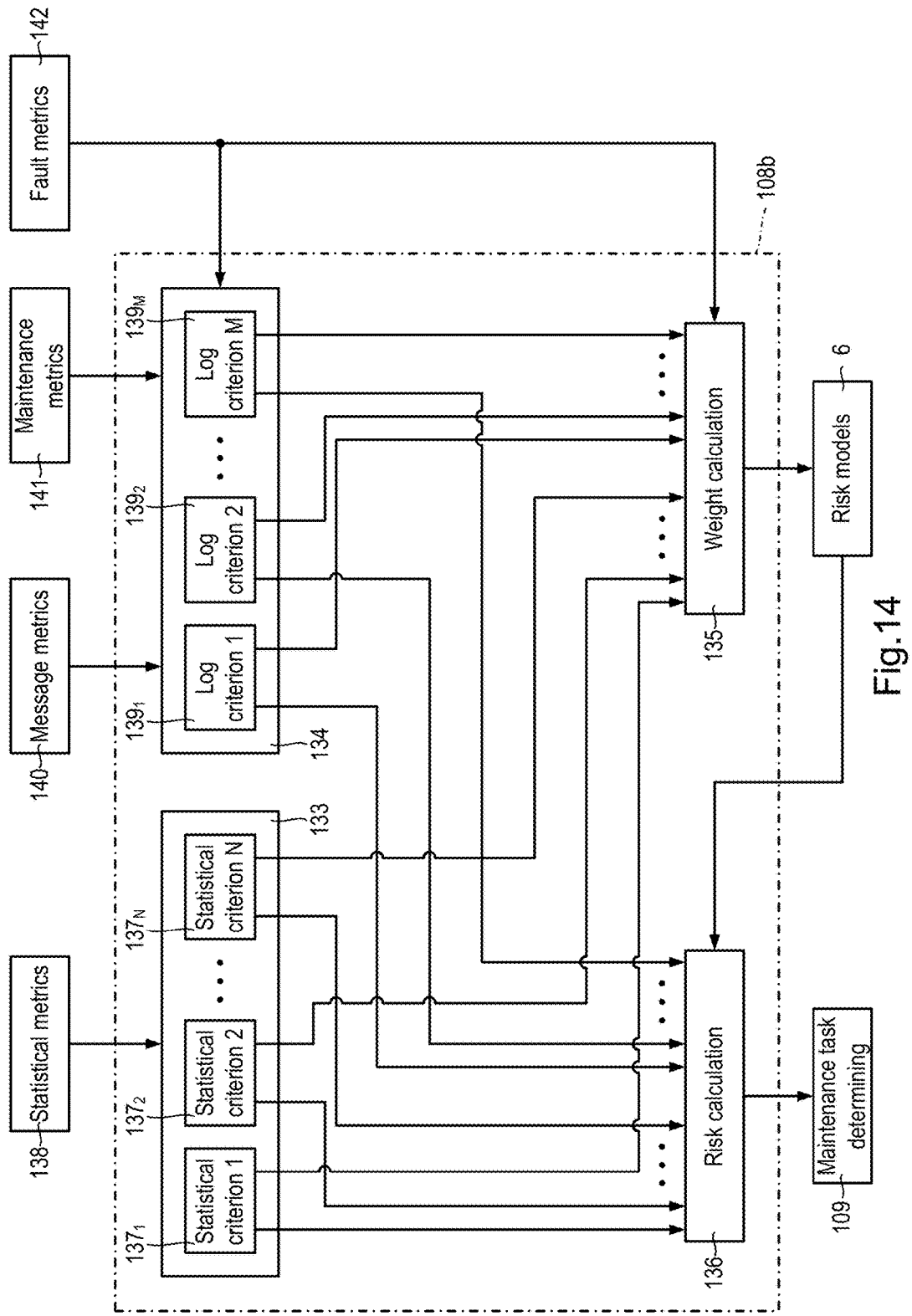
FIG. 14 is a block diagram of an exemplary risk modelling module for use in apparatus shown in FIG. 13.

Referring also to FIG. 14, an example of a weighted average risk modelling module 108b for determining and/or evaluating a weighted average risk model 6 is shown.

The weighted average risk modelling module 108b includes a statistical criteria module 133, a log criteria module 134, a weight calculation module 135 and a risk calculation module 136. The weighted average risk modelling module 108b checks the sensor logs 53 and computer readable logs 16, 17, 21 against a number of criteria and generates one or more overall risk scores, each of which is indicative of one of more fault types occurring in the machine 15 within a following period. For example, each risk score may be an estimate of the probability of the corresponding fault type developing within a following period (first type) or each risk score may indicate the relative severity of the corresponding fault type developing (second type).

The statistical criteria module 133 stores at least one statistical criterion 137. Preferably, the statistical criteria module 133 stores a number, N of statistical criteria $137_1$, $137_2, \ldots, 137_N$. The statistical criteria $137_1, 137_2, \ldots, 137_N$ may be stored in the statistical criteria module 133 or the risk modelling module 108b. Alternatively, the risk modelling module 108b may retrieve statistical criteria $137_1$, $137_2, \ldots, 137_N$ which are stored in the database 7 as part of a risk model 6.

Similarly, the log criteria module 134 stores at least one log criterion 139. Preferably, the statistical criteria module 134 stores a number, M of log criteria $139_1, 139_2, \ldots, 139_M$. The log criteria $139_1, 139_2, \ldots, 139_M$ may be stored in the log criteria module 134 or the risk modelling module 108b. Alternatively, the risk modelling module 108b may retrieve log criteria $139_1, 139_2, \ldots, 139_M$ which are stored in the database 7.

The statistical criteria 137 and the log criteria 139 are arranged into one or more fault criteria groups. Each fault criteria group corresponds to a particular fault type. Each fault criteria group may include one or more statistical criteria 137 and/or one or more log criteria 139. The fault type corresponding to a fault criteria group may be associated with the overall machine 15, a subsystem 18 or a group of sub-systems. Multiple fault types, and therefore multiple fault criteria groups, may be associated with a single sub-system 18. Each criterion 137, 139 belongs to one or more of the fault criteria groups, in other words, one criterion 137, 139 may be associated with multiple fault types.

The statistical criteria module 133 receives statistical metrics 138 from the statistical metric determining module 105. Statistical metrics 138 may be based on sensor logs 53 and/or warped sensor logs. Based on the statistical metrics 138, the statistical criteria module 133 determines whether one or more statistical criteria 137 are satisfied.

For example, when the machine 15 is a ship 15a, the statistical criteria module 133 may test two statistical criteria $137_1, 137_2$. A first statistical criterion $137_1$ may relate to temperatures of one or more propeller shaft bearings of the ship 15a. For example, a parameter curve 59 may be defined as the bearing temperature as a function of propeller shaft RPM, and this temperature-RPM curve may be compared to an average parameter curve 60 determined based on the historical data from multiple ships 15a. Each RPM value has an associated standard deviation σ determined based on the historical data. The first statistical criterion $137_1$ may be triggered when the deviation of the temperature-RPM curve from the average behaviour exceeds a threshold amount, for example, three times the standard deviation σ. An elevated bearing temperature may indicate, for example, a lack of lubrication or a developing mechanical fault with the propeller bearing mechanism. The first statistical criterion $137_1$ may be met immediately that the threshold deviation has been exceeded. Alternatively, the first statistical criterion $137_1$ may be met if the bearing temperature exceeds the threshold deviation σ certain number of times within a given period, for example, if the temperature exceeds the threshold ten or more times within five days. The comparison between the parameter curve 59 and the average parameter curve 60 may be restricted to be particular conditions, for example, only for RPM values exceeding 20 RPM, or only if the threshold is exceeded for a duration of at least 5 minutes, and so forth.

A second statistical criterion $137_2$ may compare the deviation between a pair of parameter curves 59. For example, the ship 15a may include first and second engines powering first and second propellers. The first and second engines are substantially identical in construction, to provide matched power outputs when operating correctly. Consequently, during normal operation, corresponding sensors 19 of the first and second engines produce parameter curves 59 which are substantially the same. In practice, a pair of corresponding parameter curves 59 will fluctuate by small amounts such that the parameter curves 59 are not precisely identical. However, if a difference between the parameter curves 59 exceeds a threshold amount, this may indicate a fault developing with one of the engines. The threshold may be based on historical data, for example, three times the historic standard deviation of the relevant parameter. Alternatively, the threshold may by a relative threshold, for example, if the ratio of the parameter values measure from first and second engines is outside a range centred on a value of one. The second statistical criterion $137_2$ may be met immediately that the threshold deviation has been exceeded. Alternatively, the second statistical criterion $137_2$ may be met if the deviation between first and second engines exceeds the threshold deviation a certain number of times within a given period, for example, if the parameter measured from the first engine differs by 10% or more from the parameter measured from the second engine three or more times within ten days. The comparison between the pair of parameter curves 59 may be restricted to be particular conditions in a similar way to the first statistical criterion $137_1$.

Differential comparisons such as the second statistical criterion $137_2$ are not limited to pairs of parameter curves 59. In principle deviations within any group of sub-systems may be used as statistical criteria 137. For example, a ship 15a may include a number of bilge pumps, each responsible for pumping a particular segment or partition of the ship 15a bilge. If the parameters measured from one bilge pump begin to deviate significantly from the others, this may indicate a developing problem such as, for example, a developing electrical or mechanical fault, the pump intake or outlet is becoming clogged, the corresponding segment or partition of the bilge is developing a leak, and so forth.

Optionally, whenever a statistical criterion 137 is satisfied, the weighted average risk modelling module 108b may transmit an alert message. The alert message may be sent to a local or remote receiver using wired or wireless means. For example, an automated e-mail or SMS message may be sent to an engineer or mechanic. The alert message may take the form of a message object 54 and may be recorded in the message log 21.

The log criteria module 134 receives message metrics 140, maintenance metrics 141 and fault metrics 142 from the log metric determining module 106. Based on the message metrics 140, maintenance metrics 141 and fault metrics 142, the log criteria module 134 determines whether one or more log criteria 139 are satisfied.

For example, when the machine 15 is a ship 15a, the log criteria module 134 may test two log criteria $139_1, 139_2$. A first log criterion $139_1$ may relate to a particular message object 54 generated by a sub-system 18 of the ship 15a. If the message object 54 is generated a certain number of times within a period then the first log criterion $139_1$ is satisfied, for example, 5 times in 6 days. The first log criterion $139_1$ may be tested using a message metric 140 in the form of a tally of the number of times a message object 54 having a specific message ID code (i.e. maintenance task type) occurs within a moving windowed period.

A second log criterion $139_2$ may relate to maintenance task objects 55 and/or fault objects 56. The second log criterion $139_2$ may be satisfied if a number of maintenance tasks 55 and/or fault objects 56 relating to a particular sub-system 18 are recorded within a given period. For example, if a navigational radar system of the ship 15a requires the same or similar minor maintenance tasks 55 (for example a system reset) five times within one week, this may indicate a more serious underlying or developing problem requiring more significant maintenance or replacement of parts. The second log criterion $139_2$ need not be limited to a single sub-system 18, and may encompass a number of maintenance tasks 55 and/or fault objects 56 relating to a group of sub-systems 18.

Optionally, whenever a log criterion 139 is satisfied, the weighted average risk modelling module 108b may transmit an alert message. The alert message may be sent to a local or remote receiver using wired or wireless means. For example, an automated e-mail or SMS message may be sent to an engineer or mechanic. The alert message may take the form of a message object 54 and may be recorded in the message log 21.

The preceding examples of statistical criteria 137 and log criteria 139 are not exhaustive. Depending on the specific machines 15, the number and type of available sensors 19, availability of message and maintenance logs 140, 141, the statistical criteria 137 and log criteria 139 may vary considerably.

The weighted average risk modelling module 108b may operate to determine weights from historical data or to apply weights to new data.

For the first type of weighted average risk model 6, the weight calculation module 135 receives fault metrics 142 from the log metric determining module 106 and receives information about which statistical criteria 137 and which log criteria 139 are satisfied. The weight corresponding to a particular criterion 137, 139 is calculated in the form of a probability of a fault developing, based on the frequencies of relevant fault objects 56 occurring within a predetermined or user determinable period after the criterion 137, 139 is satisfied. For example, for occasions when the first statistical criterion $137_1$ is satisfied, the weight may be calculated as the fraction or percentage of such occasions which were followed by a relevant fault object 56 within 30 days. The weight calculation module 135 may determine, based on the statistical metrics 138 or log metrics 140, 141, 142, a first number, $n_1$, of occasions for which the criterion 137, 139 was satisfied. The weight calculation module 135 may determine, based on the fault log 17 and the statistical metrics 138 or log metrics 140, 141, 142, a second number, $n_2$, of occasions for which the criterion 137, 139 was satisfied and the corresponding fault type occurred within the predetermined or user determinable period after the criterion 137, 139 is satisfied.

A relevant fault object 56 has a fault type (e.g. a fault ID code) which corresponds to one or more fault criteria groups including the criterion 137, 139. In one example, a relevant fault type may be associated with the same sub-system 18 or group of sub-systems 18 as the criterion 137, 139. In an example where a fault criteria group is associated with a single sub-system 18, a log criterion 139 may be based on a message having an ID code C-M-026, and a fault object 56 having a fault ID code of C-F-001 may be a relevant fault object 56 because both relate to the "C" sub-system 18. Alternatively, in an example where a fault criteria group is associated with a group of sub-systems 18, for example, if a "G" sub-system 18 is linked to "H" and "K" sub-systems 18, a log criterion 139 may based on a message having an ID code G-M-006, and fault objects 56 having fault ID codes of G-F-051, H-F-005 or K-F-009 may all be relevant.

The set of weights corresponding to each criterion 137, 139 form the risk model 6, which is stored to the database 7. The risk model 6 may also include details of the specific criteria 137, 139 to be applied. This enables the system 100 to use risk models 6 having different criteria to model the risk of faults developing in different sub-systems 18.

The weights need not be calculated in the form of probabilities. For the second type of weighted average model, the weights for each criterion 137, 139 may take the form of importance metrics determined based on the relative importance of the sub-system 18 or group of sub-systems 18 which correspond to the criterion 137, 139. For example, criteria 137, 139 relating to the engines or fire suppression systems of a ship 15a may have a relatively high weight whereas criteria 137, 139 relating to environmental controls in the crew areas may have a relatively low weight. Importance metrics may be calculated based on historical fault data. For example, the importance metrics may be calculated based on and average delay or other cost associated with rectifying historic faults in the corresponding sub-system 18 or group of sub-systems 18.

The risk calculation module 136 receives information about which (if any) criteria 137, 139 have been satisfied and retrieves the corresponding weights from a corresponding stored risk model 6. For each fault criteria group, provided at least one of the corresponding criteria 137, 139 has been satisfied, the risk calculation module 136 calculates a risk score for the fault criteria group by summing the weighting values corresponding to each satisfied criterion included in the fault criteria group. Fault types may be associated with the overall machine 15, a sub-system 18 or group of sub-systems 18. The risk scores are output to the maintenance task determining module 109. Optionally, the weights 137, 139 corresponding to individually satisfied criteria are additionally output to the maintenance task determining module 109.

For the first type of weighted average risk model 6 the weights take the form of fault probabilities. In this case, the risk score generated for each fault criteria group represents an estimate of the expectation probability of the corresponding fault type developing in the machine 15, sub-system 18 or group of sub-systems 18 to which the fault criteria group relates. The risk score need not be normalised or adjusted to strictly enforce a value between zero and one. The weight of individual criteria 137, 139 will typically be low because the purpose of the system 100 is to perform preventative maintenance efficiently (i.e. whilst the overall risk score remains relatively low). However, each risk score is a simple sum of the weights, and as such may in principle exceed a value of one. Even if a risk score does exceed a value of one, the risk score nonetheless remains indicative of the relative risk of a corresponding fault type developing.

For the second type of weighted average risk model 6, the weights take the form of importance metrics. In this case, the generated risk score remains indicative of the probability of a fault, but the risk score is not necessarily proportional to the probability of a fault developing. Instead, each risk score is indicative of the severity of an associated fault type, which may be used to rank maintenance priorities for the machine 15, sub-system 18 or group of sub-systems 18 to which the corresponding fault criteria group relates.

The criteria 137, 139 and criteria group memberships used in a risk model 6 may be user defined based on the experience of engineers and mechanics familiar with the machines 15. Alternatively, the criteria 137, 139 and criteria group memberships used in a risk model 6 may be derived automatically from analysis of historic sensor logs, 53, maintenance logs 16, fault logs 17, message logs 21, and so forth. For example, for each fault object 56 corresponding to a particular fault type (e.g. fault ID code), a preceding interval may be analysed to determine patterns of statistical metrics and/or log metrics 140, 141, 142 which are not attributable to a null hypothesis.

The specific criteria 137, 139 may be developed through a combination of user input and automated analysis. For example, an engineer or mechanic may setup a criteria group including one or more statistical criteria 137 or log criteria 139 by operating the user interface 104. The weighted average risk modelling module 108b may then analyse whether the user defined criteria 137, 139 correspond to a statistically significant population of fault objects 56 within the following period. This can assist the engineer or mechanic in developing effective criteria 137, 139.

Method of Generating a Risk Model

Figure 15:
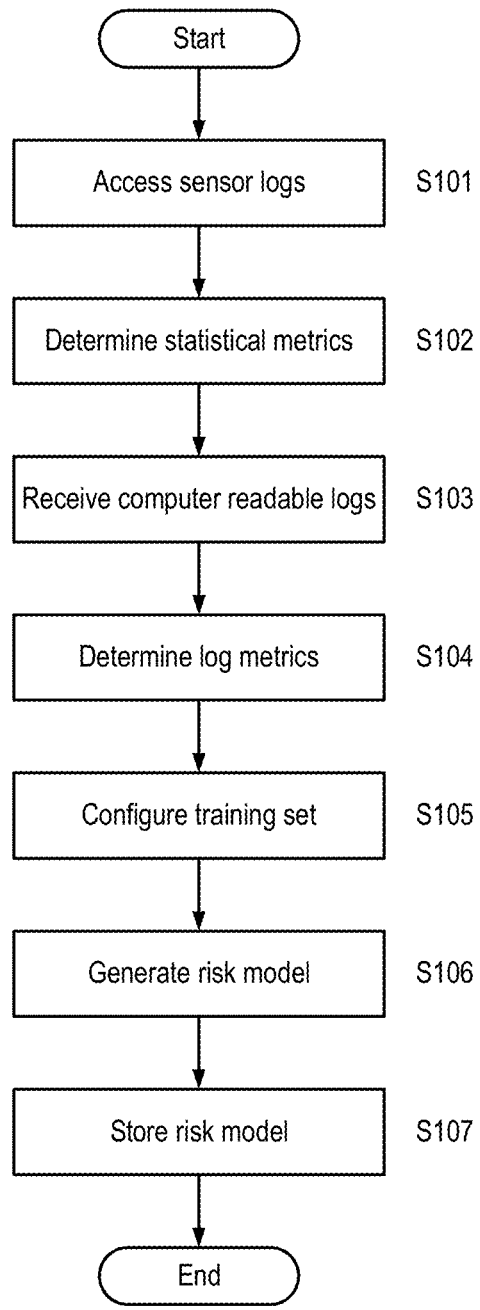
FIG. 15 is a process flow diagram of a method of generating a risk model according to embodiments of this specification.

Referring also to FIG. 15, a method of generating a risk model 6 using the apparatus 101 for modelling machines 15 is explained.

The statistical metric determining module 105 accesses sensor logs 53 corresponding to one or more machines 15 (step S101). The accessed sensor logs 52 may correspond to multiple operations of the corresponding machines 15, for example, one or more journeys or working days of a ship 15a or a construction machine 15b.

The statistical metric determining module 105 determines statistical metrics in dependence upon the accessed sensor logs (S102). For example, as explained hereinbefore with reference to FIG. 5, the statistical metric determining module 105 may determine the mean, standard deviation, minimum and/or maximum of a difference between a parameter curve corresponding to a sensor log 53 (for example parameter curve 59) and an average parameter curve (for example average parameter curve 60) determined by aggregating a large number of sensor logs 53 from a number of different machines 15 and/or operations of the machines 15.

Alternatively, the statistical metric determining module 105 may access warped sensor logs previously generated by the sensor log warping module 111 and stored in the database 7. Each warped sensor log corresponds to one sensor log 53. The statistical metric determining module 105 may determine statistical metrics in dependence upon the warped sensor logs. The statistical metric determining module 105 may access a mixture of sensor logs 53 and warped sensor logs, and determine statistical metrics in dependence upon the mixture of sensor logs 53 and warped sensor logs.

Alternatively, the sensor log warping module 111 may access sensor logs 53 corresponding to one or more machines 15 and generate corresponding warped sensor logs. The statistical metric determining module 105 may determine statistical metrics in dependence upon the warped sensor logs in the same way.

The log metric determining module 106 accesses computer readable logs corresponding to one or more machines 15 (step S103). The accessed computer readable logs may correspond to multiple operations of the corresponding machines 15, for example, one or more journeys or working days of a ship 15a or a construction machine 15b. The computer readable logs include maintenance logs 16, message logs 21 and fault logs 17. Additional computer readable logs may be accessed such as, for example, crew logs 22, bridge logs 23, environmental data 27, route/task logs 28 and so forth.

The log metric determining module 106 determines log metrics in dependence upon the computer readable logs. For example, if the computer readable logs 16, 17, 21 include free-text information, the log metric determining module 106 may perform keyword searching to establish frequencies of occurrence of particular words or phrases during one or more time intervals. The log metric determining module 106 may employ natural language processing to determine patterns in free-text information. Additionally or alternatively, message objects 54 in message logs 21, maintenance task objects 55 in maintenance logs 16 and fault objects 57 in fault logs 17 may include ID codes, and the frequencies of occurrence of each ID code during one or more time intervals may be used as log metrics. The log metric determining module 106 may search for ID codes in free text information.

The training set formatting module 107 configures a training set including the statistical metrics and log metrics (step S105). The training set is for use as a basis for generating a corresponding risk model 6. The statistical metrics and the log metrics derived from the maintenance logs 16 and message logs 21 may provide test inputs for a machine learning risk model 6. Log metrics derived from the fault logs 17 provide corresponding test outputs for a machine learning risk model 6. Log metrics derived from the fault logs 17 may also provide test inputs for a machine learning risk model 6. Alternatively, the statistical metrics and the log metrics derived from the maintenance logs 16, message logs 21 and fault logs 17 may be used to determine weights and/or criteria 137, 139 for a weighted average risk model 6 of the first or second types. The configuration of the training set will depend on the type of risk model 6 which the risk modelling module 108 generates.

The risk modelling module 108, 108b generates a risk model 6 based on the training set received from the training set formatting module 107 (step S106). The risk model 6 may be a machine learning random forest model. Alternatively, a machine learning risk model 6 may be any other suitable type of machine learning model such as, for example, a kernel random forest, an artificial neural network, a Bayesian network, a hidden Markov model and so forth. The risk modelling module 108 iterates a machine learning risk model 6 so as to minimise a difference between predicted probabilities of each fault type (for example each fault ID code) developing in the machine 15 (or a subsystem 18), and the observed probabilities of each fault type. The observed probabilities which determined probabilities are compared against are based on log metrics derived from the fault logs 17.

Alternatively, the risk model 6 may be a weighted average risk model 6. Weighted average risk models 6 fall into two main categories. A first type of weighted average risk model 6 uses weights in the form of probabilities/frequencies to calculate one or more risk scores in the form of estimated probabilities, each risk score being indicative of a probability that a corresponding fault will occur in an associated machine 15, sub-system 18 of the machine, or group of sub-systems 18. A second type of weighted average risk model 6 uses weights in the form of importance metrics to calculate one or more risk scores, each risk score being indicative of the relative seriousness of faults which may be developing in a machine 15, a sub-system 18 of the machine, or in a group of sub-systems 18.

The risk model 6 takes as input the statistical metrics and log metrics derived from the maintenance logs 16 and message logs 21. The inputs to a risk model 6 correspond to a preceding interval such as, for example, one day, three days, one week, a month and so forth. The risk model 6 estimates probabilities or risk scores of each fault type for a future interval. The future interval may be, for example, a day, two days, three days, a week, two weeks, a month and so forth. Once the risk model 6 has been generated, the risk model 6 may be applied to determine or predict fault probabilities for a future interval.

The risk modelling module 108 passes the generated risk model 6 to the database 7 for storage (step S107). In this way, a stored risk model 6 may be used to predict the probability or risk score of each fault type (for example each fault ID code) occurring for a machine 15, sub-system 18 or group of sub-systems 18 within a future interval, based on recent sensor logs 53, maintenance logs 16, message logs 21 and optionally fault logs 17.

Method of Determining Fault Probabilities

Figure 16:
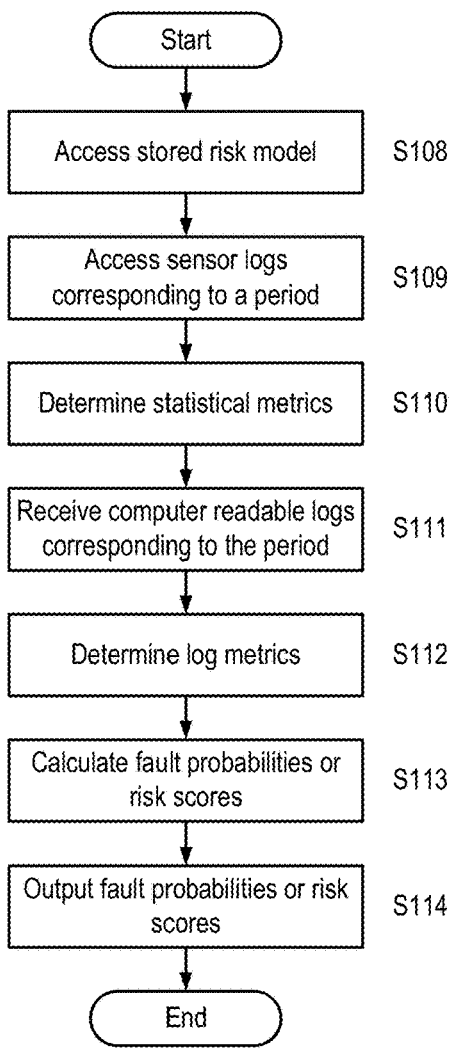
FIG. 16 is a process flow diagram of a method of determining fault probabilities or risk scores for a machine according to embodiments of this specification.

Referring also to FIG. 16, a method of determining fault probabilities for a machine 15, or a sub-system 18 of the machine 15 is explained.

The maintenance task determining module 109 controls the risk modelling module 108 to retrieve a risk model 6 corresponding to a machine 15 or a sub-system 18 of the machine (step S108)

The statistical metric determining module 105 accesses sensor logs 53 corresponding to a machine 15 for which fault probabilities or risk scores are to be determined and spanning a preceding interval (step S109). One or more sensor logs 53 may be accessed for the machine in question, depending on the length of the preceding interval, for example, one or more journeys or working days of a ship 15a or construction machine 15b.

The statistical metric determining module 105 determines statistical metrics based on the accessed sensor logs 53 corresponding to the preceding interval, and provides the statistical metrics to the risk modelling module 108 (step S110). The statistical metric determining module 105 determines statistical metrics in the manner described hereinbefore.

The log metric determining module 106 accesses computer readable logs 16, 17, 21 spanning a preceding interval and corresponding to a machine 15 for which fault probabilities are to be determined (step S111). The accessed computer readable logs 16, 17, 21 may include maintenance task objects 55, fault objects 56 and message objects 54 corresponding to one or more operations of the corresponding machine 15, depending on the length of the preceding interval, for example, one or more journeys or working days of a ship 15a or construction machine 15b.

The log metric determining module 106 determines log metrics based on the accessed computer readable logs 16, 17, 21, and provides the log metrics to the risk modelling module 108 (step S112). The log metric determining module 106 determines log metrics in the manner described hereinbefore.

The risk modelling module 108, under the control of the maintenance task determining module 109, determines probabilities or risk scores for each fault type (for example each fault ID code) which is predicted by the risk model 6 (step S113). The fault types for which probabilities are generated depend on the fault types which were included in the original training set for generating the risk model 6. Fault probabilities may correspond to a probability of failure over a following interval, for example, one day, two days, three days, one week, a month and so forth.

The maintenance task determining module 109 outputs the fault probabilities or risk scores (S114). For example, the maintenance task determining module 109 outputs fault probabilities or risk scores to a robotic maintenance system 102, which may select and carry out a priority maintenance task based on the determined fault probabilities or risk scores. A sub-system 18 having the highest fault probability or risk score (of one or more fault types), may be prioritised for maintenance.

Alternatively, the maintenance task determining module 109 may output the fault probabilities or risk scores to the report generation module 103, which prepares and outputs a physical report to aid an engineer or mechanic in determining a priority maintenance task. Even though an engineer or mechanic may ultimately take a decision, the determined fault probabilities or risk scores provide them with additional technical information on which to base the decision.

In other examples, the maintenance task determining module 109 may output the fault probabilities or risk scores to the user interface 104. The maintenance task determining module 109 may also output further information to the user interface such as, for example, a list of fault types (for example fault ID codes) ranked according to the corresponding fault probabilities or risk scores. Even though an engineer or mechanic operating the user interface 104 may ultimately take a decision, the determined fault probabilities or risk scores provide them with additional technical information on which to base the decision.

Figure 17:
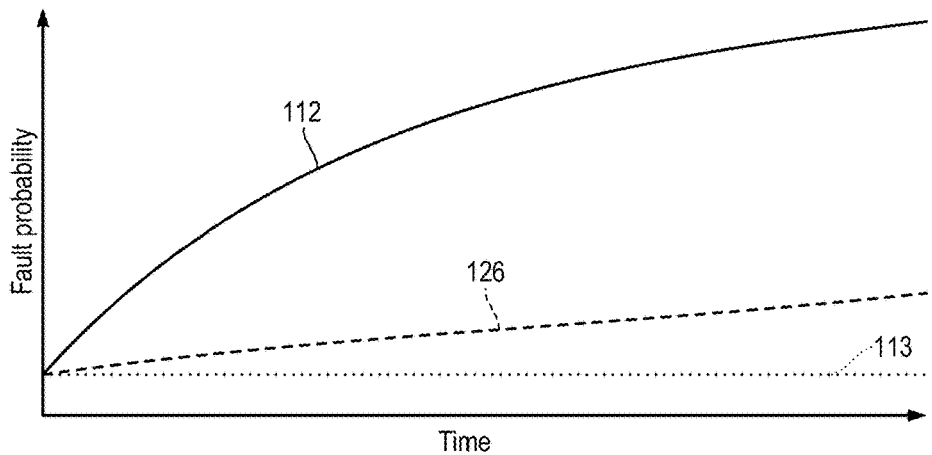
FIG. 17 illustrates determined fault probabilities as a function of time.

The calculation of fault probabilities may be repeated for different durations of the following interval. For example, referring also to FIG. 17, a probability of a specific fault type (for example a fault ID code), or the overall probability of any fault occurring, may be determined as a function of the following interval duration and displayed by the user interface 104 as a fault probability curve 112. A baseline, or overall probability 113 of the same fault occurring may also be displayed for comparison, for example determined across an entire fleet of construction machines 15b or ships 15a.

When the risk model 6 is a machine learning model, the calculation of a fault probability curve may optionally be repeated for different lengths of following interval and assuming that a particular maintenance task will be carried out. For example, by adding a maintenance task object 55 corresponding to particular maintenance task to a modified maintenance log and re-calculating a modified fault probability curve 126 using the risk model 6.

Method of Determining a Priority Maintenance Task

Figure 18:
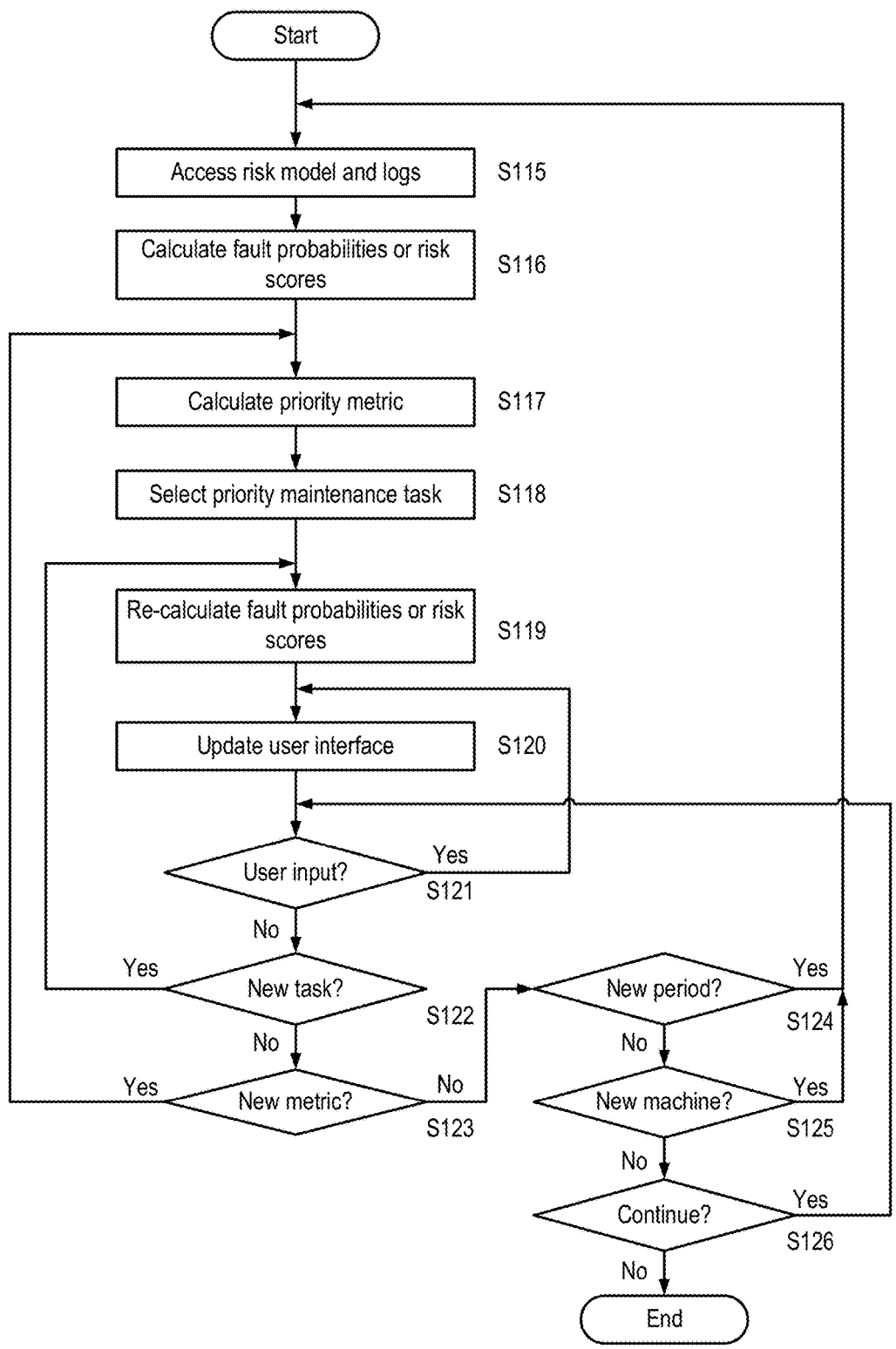
FIG. 18 is a process flow diagram of a method of determining a maintenance task for a machine according to embodiments of this specification.

Referring also to FIG. 18, a method of determining a priority maintenance task is explained.

A risk model 6 for a machine 15 is accessed, and sensor logs 53 and computer readable logs 16, 17, 21 corresponding to a preceding interval are accessed and processed to determine statistical metrics and log metrics (step S115). For example, the maintenance task determining module 109 may control the risk modelling module 108 to retrieve a risk model 6 corresponding to a machine 15, a sub-system 18 of the machine 15 or a group of sub-systems 18, to obtain statistical metrics 138 determined based on sensor logs 53 corresponding to a preceding interval and to obtain log metrics 140, 141, 142 determined based on computer readable logs 16, 17, 21 and corresponding to the preceding interval. The statistical metrics 138 and log metrics 140, 141, 142 all relate to the particular machine 15 being analysed.

Figure 19:
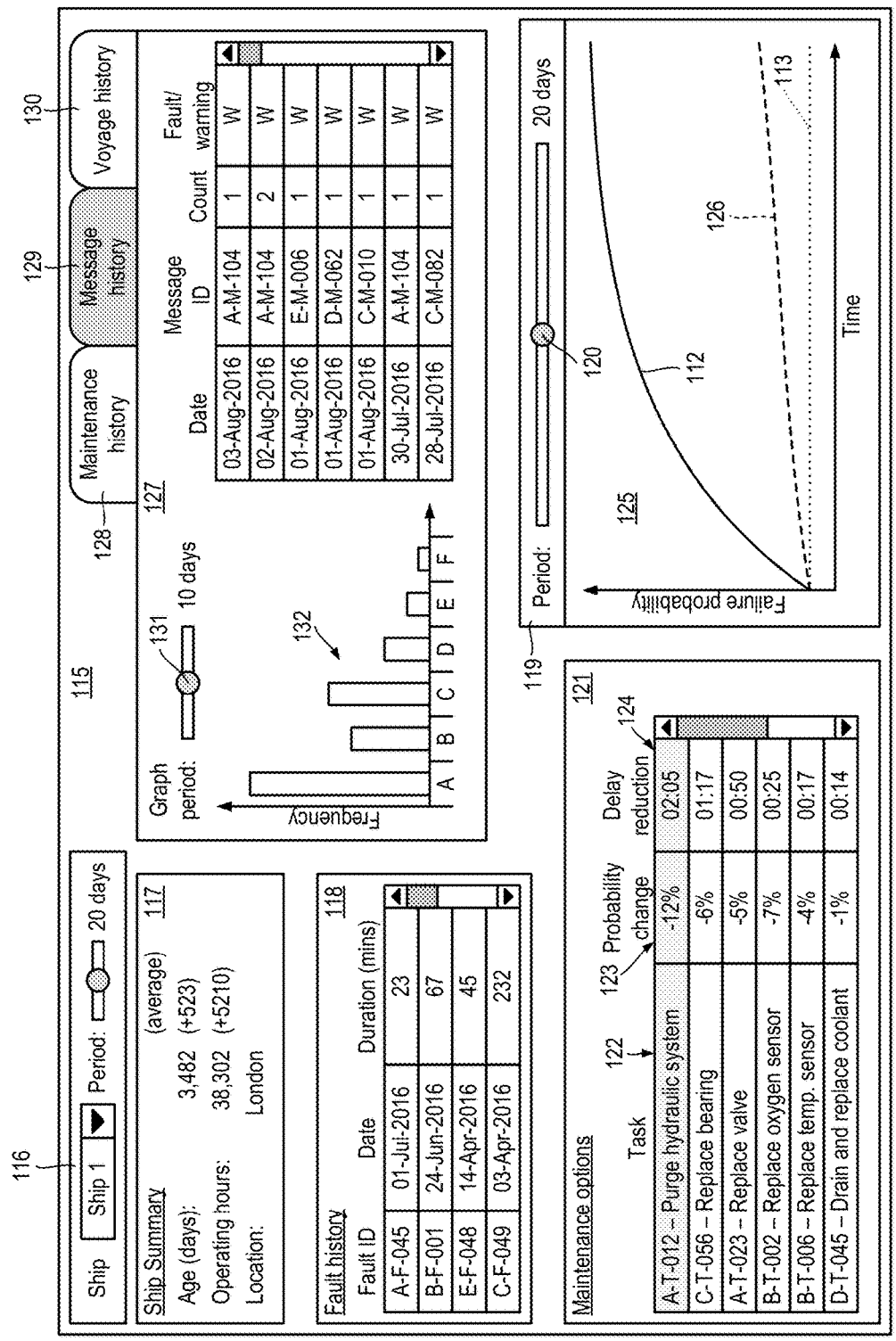
FIG. 19 shows a graphical user interface for selecting a maintenance task for a machine according to embodiments of this specification.

The selection of a machine 15 may be provided via the user interface 104. For example, referring also to FIG. 19, a user interface 104 in the form of a maintenance graphical user interface (GUI) 115 for a fleet of ships 15a is shown. The maintenance GUI 115 is based on a risk model 6 in the form of a machine learning model or a weighted average model of the first type. The maintenance GUI 115 includes a ship selection pane 116 including a drop-down selection tool for selecting a ship 15a to analyse for determining a priority maintenance task. The ship selection pane 116 also includes a slider control for selecting the length of the preceding interval.

The maintenance GUI 115 also includes a ship summary pane 117. The ship summary pane 117 presents summary information about the ship 15*a* selected using the selection pane 116. The summary information includes the age of the selected ship 15*a*, the total number of operating hours and a current location of the ship 15*a*. The ship summary pane 117 may be populated with information retrieved from the database 7. The maintenance GUI 115 also includes a fault history pane 118. Based on the accessed fault log 17, the fault history pane 118 is populated with a list of a number of faults which have previously occurred for the selected ship 15*a*. For example, the fault history pane 118 may provide, for each recent fault detailed by a fault object 56 in the fault log 17, a fault ID code which identifies the fault type, the date of the fault and duration before the fault was resolved. In other examples, the fault history pane 118 may provide any other information associated with a fault object 56.

Fault probabilities or risk scores corresponding to each fault type (for example each fault ID code) included in the risk model 6 are calculated for a following interval (step S116). For example, the risk modelling module 108, under the control of the maintenance task determining module 109, may determine the probabilities or risk scores of each fault type. The risk modelling module 108 may use a machine learning model or a weighted average model. The fault types for which probabilities or risk scores are generated depend on the fault types which were included in the original training set.

The following time interval for which fault probabilities or risk scores are calculated may be received via the user interface 104. For example, the maintenance GUI 115 may include a fault probability pane 119 including a following interval selection control, in this example a slider control 120, for receiving the length of the following interval as a user input. The following time interval may be, for example, one day, two days, a week, a month and so forth. Risk models 6 may be a group of risk models, each corresponding to a supported preceding interval and following interval. For example, the weights of a weighted average risk model 6 of the first type may be determined based on 10, 11, . . . , 20 days following satisfaction of a criterion 137, 139, to allow the fault probability pane 119 to be quickly updated when the slider control 120 is altered.

A priority metric is calculated corresponding to each fault type (for example each fault ID code) for which a probability is determined, or a priority metric is calculated corresponding to each correlated maintenance task (step S117). For example, when the risk modelling module 108 determines probabilities or risk scores in the form of probabilities (machine learning models or weighted average models of the first type), the maintenance task determining module 109 determines a fault metric based on the probabilities for each fault type (for example, for each fault ID code). The fault metric for each fault type may be the probability of that fault type occurring. Alternatively, the maintenance task determining module 109 may control the fault maintenance correlation module 110 to access the fault logs 17 and to determine, for each relevant fault type, an average fault duration based on fault objects 56 having that fault type. The maintenance task determining module 109 may calculate the fault metric for each fault type as a product of the fault probability and the average fault duration, i.e. the expectation value of delay for each fault type.

Alternatively, the maintenance task determining module 109 may calculate the fault metric for each fault type as a product of the fault probability and a "severity score", which is a user determinable value reflecting the importance of the associated sub-system 18. For example, when the machine 15 is a ship 15*a*, sub-systems 18 relating to the engines may have a relatively high severity score because a drifting ship may run around or become swamped in rough seas. By contrast, a sub-system controlling emergency lighting in the crew cabins may have a lower severity score. In other words, the fault metric may be determined based on the consequences of a fault.

When the risk modelling module 108 determines risk scores based on a weighted average model of the second type, the risk scores may be used as fault metrics without further processing.

In another example, the maintenance task determining module 109 may determine a priority metric by repeated application of a machine learning risk model 6. For example, the maintenance task determining module 109 may control the fault maintenance correlation module 110 to analyse the maintenance and fault logs 16, 17 and compile a list of all correlated maintenance tasks. In this context, a correlated maintenance task is a maintenance task (for example corresponding to a maintenance task type or ID code) which has previously been performed in connection with a fault type. For each correlated maintenance task, the maintenance task determining module 109 may control the risk modelling module 108 to repeat the probability calculations using the machine learning risk model 6 and a modified maintenance log. The modified maintenance log is formed by taking the original maintenance log 16 and adding an additional maintenance task object 55 corresponding to the correlated maintenance task. In this way, the probability of each fault type may be calculated under the assumption that the correlated maintenance task is carried out. For each correlated maintenance task, the maintenance task determining module 109 may re-determine the fault probabilities, and determine a maintenance task metric in the form of a change in the overall expectation delay, i.e. the sum of the predicted probabilities and the average associate durations of each fault type. The maintenance task metric may be used as the priority metric.

A priority maintenance task is selected based on the values of the priority metric (step S118). For example, the maintenance task determining module 109 may rank each predicted fault type according to the values of the fault metric and select a priority fault type based on the ranking. The maintenance task determining module 109 controls the fault maintenance correlation module 110 to determine a priority maintenance task associated with the priority fault. The fault maintenance correlation module 110 analyses the fault logs 17 and maintenance logs 16 to determine the maintenance task which has the highest probability of resolving the priority fault. For example, on prior occasions on which a fault type corresponding to a fault ID code A-F-004 has occurred, the fault may have been resolved by a maintenance task corresponding to a maintenance task ID code (i.e. a maintenance task type) of A-T-024 in 65% of previous occurrences of the same fault, by a maintenance task corresponding to a maintenance task ID code (i.e. a maintenance task type) of A-T-005 in 20% of previous occurrences of the same fault, and by a maintenance task corresponding to a maintenance task ID code (i.e. a maintenance task type) of A-T-042 in 15% of previous occurrences of the same fault. In this example, the maintenance task corresponding to maintenance task ID (i.e. maintenance task type) code A-T-024 would be selected as the priority maintenance task.

In an example for which a priority metric is determined by repeated application of a machine learning risk model 6 to determine the maintenance task metric, the priority maintenance task may be selected as the possible maintenance task which gives rise to the largest reduction in the expectation delay.

For example, the maintenance GUI 115 includes a maintenance options pane 121, which presents a list of correlated maintenance tasks, with the priority maintenance task listed first and highlighted. The maintenance options pane 121 includes a list presented in three columns 122, 123, 124. A first, task column 122 provides details of the correlated maintenance tasks in the form of a maintenance task ID code (i.e. a maintenance task type) and a brief plain text description of that task. The correlated maintenance tasks may correspond to the maintenance tasks determined by the fault maintenance correlation module 110 to have the highest probability of resolving each fault type for which a fault probability is determined. Alternatively, the possible maintenance tasks may correspond to all possible maintenance tasks which have previously been performed in connection with the fault types for which fault probabilities are determined. A second, probability change column 123 provides details of an expected change in fault probability if the corresponding maintenance task is carried out.

The expected change in fault probability may be calculated by re-running a machine learning risk model 6 using a modified maintenance log. Alternatively, for a weighted average risk model 6 of the first type, the expected change in fault probability may be calculated based on the probability that a particular maintenance task will resolve a fault. For example, if a criterion 137, 139 is satisfied and has a corresponding weight, or estimated fault probability of 0.11 for a fault to develop in given sub-system 18, and if a selected maintenance task has a 0.75 probability of resolving the fault (i.e. 0.25 probability of not resolving the fault), then the overall change in the probability of a failure may be estimated based on the probability that a fault will occur and is not resolved by the selected maintenance task, i.e. the product 0.11×(1−0.75)=0.0275, so that the decrease in failure probability is 0.11−0.0275=0.0825 (8.25% reduction).

The change in fault probability may be a change in overall probability of any fault in the selected ship 15a, or a change in the fault probability for a sub-system 18 associated with the maintenance task. The change in fault probability may be a change in the probability of the corresponding fault type. A third, delay reduction column 124 provides information about a reduction in the expectation value of fault duration which is expected to result from carrying out the corresponding maintenance task. The expected reduction in the fault duration may be the change in the expectation fault duration of a corresponding fault type. The expected reduction in the fault duration may be the change in the expectation fault duration for the ship 15a overall.

The fault probabilities or risk scores are recalculated based on the risk model 6 (step S119). For example, if the risk model 6 is a machine learning risk model 6 the fault probabilities are recalculated based on a modified maintenance log which is formed by taking the original maintenance log 16 and adding an additional maintenance task object 55 corresponding to the priority maintenance task. Alternatively, if the risk model 6 is a weighted average risk model 6 of the first type, then the probabilities are re-calculated as described hereinbefore. If the risk model 6 is a weighted average risk model 6 of the second type, then the risk scores may be re-calculated by multiplying the relevant importance metric by the probability that the selected maintenance task will not resolve the fault.

For example, the fault probability pane 119 includes a graph area 125 which plots a fault probability curve 112 calculated to span the following time interval selected using the slider 120. The graph area 125 also show a baseline probability 113, and a modified fault probability curve 126 which corresponds to the fault probabilities re-calculated assuming that the priority maintenance task is carried out.

A user interface 104 is updated in dependence on the results of preceding processes (step S120). For example, if not already populated, the ship summary pane 117, fault history pane 118, maintenance options pane 121 and the graph area of the fault probability pane 119 are populated.

The maintenance GUI 115 also includes a contextual information pane 127 which is associated with a number of tabs 128, 129, 130. The contextual information pane 127 has a maintenance history tab 128, a message history tab 129 and a voyage history tab 130. In other examples, the contextual information pane 127 may include more, fewer or different tabs, depending on the information stored in the database corresponding to a selected ship 15a. In the view shown in FIG. 19, the message history tab 129 includes a table providing information about one or more message objects 54 stored in the message log 21 for the selected ship 15a. The table may include, for each type of message object 54, the date, the message ID code, a number of message objects 54 of that type, and a class of message in the form of a classification as a fault message "F" or a warning message "W".

The message history tab 129 also includes a slider control 131 to select a preceding time period to which a message frequency histogram 132 refers. The message frequency histogram 132 plots the relative frequencies of messages according to a type of message. In the example shown in FIG. 19, the message objects 54 are binned according to a sub-system 18 associated with each message object 54, i.e. "A", "B", "C" as indicated by the first character of the message ID codes.

The user interface 104 determines whether one or more user input fields have changed which do not affect the underlying fault probability or risk score data (step S121), and if such user input is received (step S121; Yes) then the user interface 104 is updated (step S120).

For example, if a different tab 128, 129, 130 of the contextual information pane 127 is selected then the contextual information pane 127 is updated to show information corresponding to the newly selected tab. The maintenance history tab 128 may show a table including dates, maintenance task ID codes (i.e. maintenance task types), and optionally further information such as free-text notes made by the engineer or mechanic who carried out the corresponding maintenance task. Any information stored in a maintenance task object 55 of the maintenance log 15 may be presented in the contextual information pane 127 when the maintenance history tab 128 is selected. Similarly, the voyage history tab 130 may show a table including details of a number of recent voyages completed by the selected ship 15a. Another example of user input which does not affect the underlying fault probability data is if a user changes the graph period controlled by the slider control 131 of the contextual information pane 127.

The user interface 104 checks whether a user has selected a different correlated maintenance task (step S122), and if they have (step S122; Yes), the modified fault probabilities or risk scores 126 are re-calculated assuming that the newly selected maintenance task is carried out (step S119). The user interface is updated (step S120).

For example, a user may select a correlated maintenance task other than the priority maintenance task using the maintenance options pane 121. The newly selected maintenance task will be highlighted and, once modified fault probabilities or risk scores have been determined, the graph area 125 of the fault probability pane 119 may be updated.

For the maintenance GUI 115, fault probabilities will also require re-calculation (steps S119 and S120) if a user selects a new following time interval using the following time interval slider 120 control of the fault probability pane 119.

In some examples, the user interface 104 may include a user input field for selecting the priority metric. If a user selection of a new metric is received (step S123; yes), the method re-calculates the new priority metric (step S117), selects a priority maintenance task based on the new metric (step S118), re-calculates fault probabilities or risk scores assuming that the priority maintenance task is carried out (step S119), and updates the user interface (step S120).

If a new preceding period is selected (step S124; Yes), the analysis is repeated (steps S115 to S120) based on the new preceding period. For example, if a new preceding period is selected using the slider of the ship selection pane 116 of the maintenance GUI 115.

If a new machine 15 is selected, the analysis is repeated (steps S115 to S120) based on the new machine 15. For example, if a new ship 15*a* is selected using the drop-down-box of the ship selection pane 116 of the maintenance GUI 115.

Until a termination command is received, the user interface 104 continues to monitor for updated user inputs (step 126; Yes).

In this way, decision making about preventative maintenance may be placed on a quantitative footing. The output of the risk modelling model is a set of probabilities or risk scores for various types of technical fault which may develop in a machine 15. These probabilities or risk scores are determined through processing of technical data such as sensor 19 measurements and computer readable logs 16, 17, 21. Instead of trying to predict precisely when a machine 15 will fail, which may be impractical in many situations, the system 100 instead aims to determine a maintenance task which will provide the greatest improvement in a metric, for example, the probability of a fault occurring or the expectation value of delay durations resulting from faults.

Although the method has been explained with reference to a user interface 104 and with further reference to an exemplary maintenance GUI 115, it should be remembered that, as explained hereinbefore, the determination and execution of a priority maintenance task may be fully automated using the robotic maintenance system 102. For example, the selected priority maintenance task (step 118) can be provided to the robotic maintenance system 102 which can carry out the priority maintenance task.

Although the exemplary maintenance GUI 115 relates to a risk model 6 in the form of a machine learning model or a weighted average model of the first type, it will be apparent that the maintenance GUI 115 may be modified for use with a weighted average risk model 6 of the second type.

Alternatively, the determination of a priority maintenance task and output of a report or work order may be fully automated using the report generation module 103. For example, the selected priority maintenance task (step 118) can be provided to the report generation module 103.

Although the method has been explained with reference to machines 15 in the form of ships 15*a*, it shall be appreciated that the method of determining a priority maintenance task and the exemplary maintenance GUI 115 may also be applied to machines 15 in the form of construction machines 15*b*, or indeed any other machines 15 incorporating sensors 19.

Modifications

It will be appreciated that many modifications may be made to the embodiments hereinbefore described. Such modifications may involve equivalent and other features which are already known in the design, manufacture and use of data processing and analysis systems and which may be used instead of or in addition to features already described herein. Features of one embodiment may be replaced or supplemented by features of another embodiment.

Second User Interface

Figure 20:
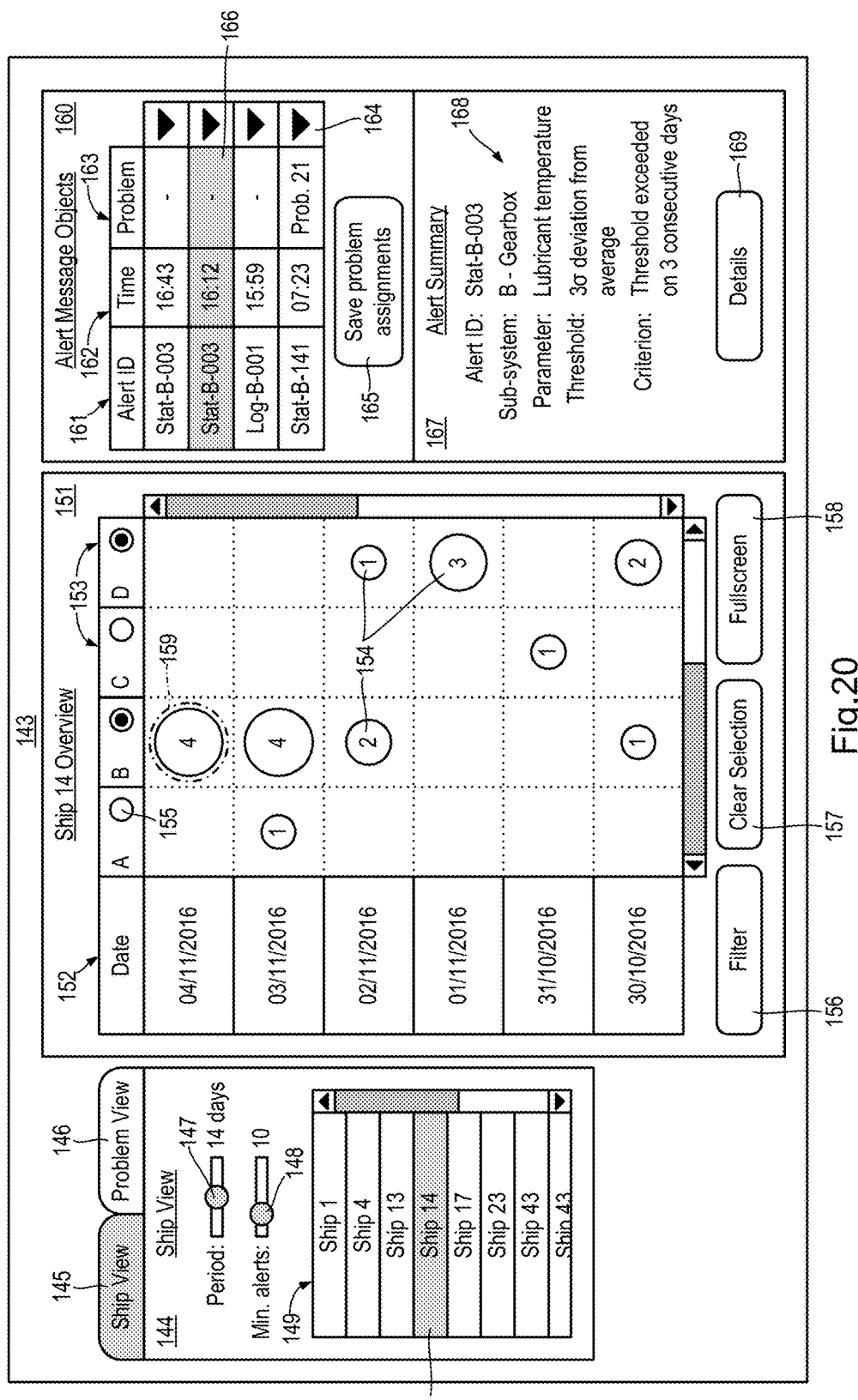
FIG. 20 shows a graphical user interface for reviewing alert messages generated in accordance with embodiments of this specification.

Referring also to FIG. 20, a second graphical user interface (GUI) 143 is shown.

The second GUI 143 allows an engineer or mechanic to investigate preventative maintenance options for a set of machines 15 based on an underlying weighted average risk model 6 (of the first or second type). In the example shown in FIG. 20, the machines 15 correspond to a fleet of ships 15*a*. The second GUI 143 uses message objects which are triggered by one or more criteria 137, 139 of a weighted average risk model, which shall be referred to as "alert" message objects 54.

The second GUI 143 includes a filter pane 144. The filter pane 144 includes a "Ship View" tab 145 for filtering and listing ships 15*a* associated with a system 100 for prevent faults. The filter pane 144 also includes a "Problem View" tab 146 for filtering and listing tracked problems. Tracked problems may be used to link alert interrelated message objects 54, maintenance task objects 55 and/or fault objects 56. Tracked problems are further described hereinafter. With the "Ship View" tab 145 selected, the filter pane 144 includes a first slider 147 to set a preceding interval and a second slider 148 to set a minimum number of alert message objects 54. The ships 15*a* belonging to the fleet are filtered based on the preceding interval and the minimum number of alert messages. All ships 15*a* for which the set minimum number of alert messages occurred within the set preceding interval are listed in a filtered ship list 149. The filtered ship list 149 may be sorted, for example, alphabetically, numerically or according to the total number of alert message objects 54 within the preceding interval. One ship 15*a* in the filtered ship list 149 is the selected ship 150, which is highlighted. By default, the first ship in the filtered ship list 149 is the selected ship 150. A user may change the selected ship 150 by selecting a different entry in the filtered ship list 149.

The second GUI 143 includes a selected ship overview pane 151 which presents a visual breakdown of the alert message objects 54 for the selected ship 150 as a function of time and sub-system 18. The selected ship overview pane 151 includes a date column 152 and one or more sub-system columns 153. Each sub-system column 153 corresponds to a sub-system 18 of the ship 15*a* which is associated with an alert message object 54. Each row of the selected ship overview pane 151 corresponds to a day within the preceding period. When, on a particular date, one or more alert message objects 54 corresponding a particular sub-system 18 were generated, a visual indicator 154 is added to the corresponding row and column of the selected ship overview pane 151. The number of alert message objects 54 corresponding a sub-system 18 on the same date is indicated through the size of the visual indicator 154, and optionally by labelling the visual indicator 154 with the number of alert message objects 54. The number of sub-systems 18 in a ship 15*a* may be large, for example tens, hundreds or thousands.

The data shown in the selected ship overview pane 151 may be filtered and may only present sub-system columns 153 which include at least one alert message object 54 within the preceding interval.

The selected ship overview pane 151 includes a number of additional controls. Each sub-system column 153 includes a selection toggle control 155. The user of the second GUI 143 may be interested in only a few sub-systems 18 amongst the presented sub-system column 153. The user may select specific sub-system columns 153 using the selection toggle controls 155, to restrict the selected ship overview pane 151 to show only the selected sub-system columns 153 using a "Filter" button 156. The user may clear selections and restore the selected ship overview pane 151 to the default view using a "Clear Selection" button 157. A "Fullscreen" button 158 may be used to switch to a view of the selected ship overview pane 151 which fills most of the viewable area on a display screen.

The user may select a selected visual indicator 159, for example, by left clicking a computer mouse while a cursor is located over a particular visual indicator 154. An alert message objects pane 160 presents a listing of the alert message objects 54 corresponding to the selected visual indicator 159. An alert ID column 161 lists alert ID codes corresponding to the criterion 137, 139 which was satisfied to trigger the alert message object 54. For example, the alert ID code Stat-B-003 may correspond to a third statistical criterion 137$_3$ associated with a sub-system 18 labelled "B". Similarly, the alert ID code Log-B-001 may correspond to a first log criterion 139$_1$ associated with a sub-system 18 labelled "B". A time column 162 includes the time at which each alert message object 54 was generated. A tracked problem column 163 indicates which, if any, tracked problem an alert message object 54 has been associated with. Each row of the alert message objects pane 160 includes a drop down control 164 to allow a user to select an existing tracked problem, or to create a new tracked problem, to be associated with an alert message object 54. The tracked problems for selection may be filtered by the user typing one or more characters forming the initial part of a tracked problem name into a row of the tracked problem column 163. The user may update the association of alert message objects 54 with tracked problems using a "Save problem assignments" button 165. If the user wishes to create a new problem, they may so by simply typing a new, unique name for the new tracked problem into the tracked problem column 163 before using the "Save problem assignments" button 165.

In this way, an engineer or mechanic may link related alert message objects 54 to a tracked problem. This enables greater consistency between different engineers and/or mechanics working on a ship 15$a$ at different times or in different locations. For example, if an engineer or mechanic determines that two or more alert messages are linked, they may record this in a tracked problem. This may save time should the same cluster of alert message objects recur subsequently, since the existing tracked problem will record the connection. A work order generated by the report generation module 103 and/or the user interface 104 may also be linked to a tracked problem. If an alert message object 54 linked to the tracked problem recurs, then this may provide information about the effectiveness of maintenance task objects 55 associated with the work order.

The user may select a selected alert message object 166 within the alert message objects pane 160 to see a summary of the selected alert message object 166 in an alert summary pane 167. The alert summary pane 167 presents summary information 168 about the selected alert message object 166. The summary information 168 may include the alert ID, a brief description of the associated sub-system 18, and information about the criterion 137, 139 which was satisfied in order to generate the alert message object 54. For example, if the selected alert message object 166 was triggered by a statistical criterion 137, then the summary information 168 may identify the relevant parameter, threshold and condition.

The user may view further details of the selected alert message object 166 using a "Details" button 169. When the "Details" button is selected, a third GUI 170 is opened (FIG. 21).

Figure 21:
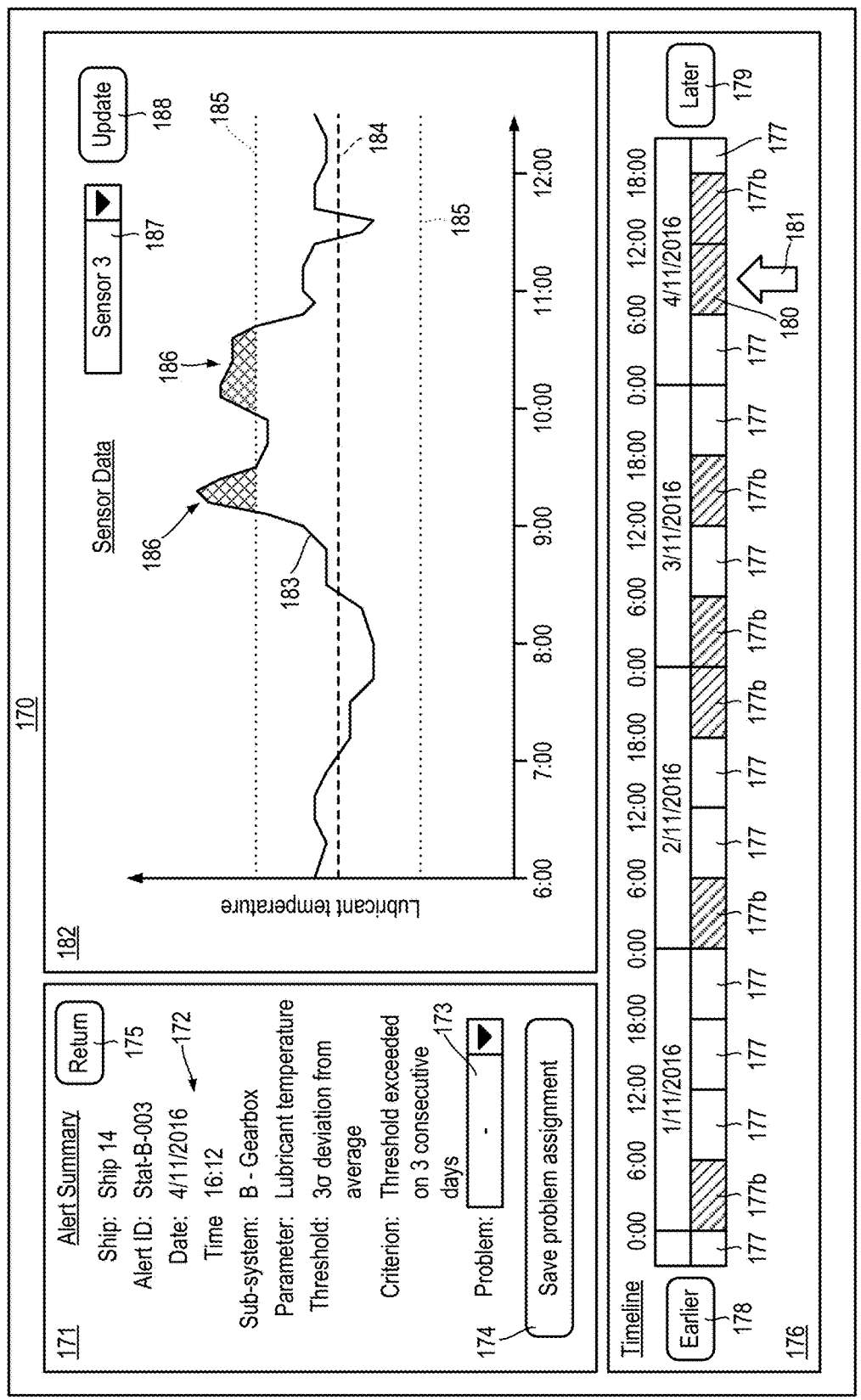
FIG. 21 shows a graphical user interface for analysing alert messages generated in accordance with embodiments of this specification.

Referring also to FIG. 21, an example of the third GUI 170 is shown.

The third GUI 170 includes an alert summary pane 171. The alert summary pane 171 includes summary information 172 which includes at least the summary information 168 and optionally additional information such as the ship, date and time associated with the selected alert message object 166. The alert summary pane 171 also include a drop down control 173 and a "Save problem assignment" button 174 to allow the user to set or edit a tracked problem associated with the selected alert message object 166 within the third GUI 170. The alert summary pane 171 also includes a "Return" button 175 to return to the second GUI 143.

The third GUI includes a timeline pane 176. Information from the sensor logs 53 or computer readable logs 16, 17, 21 is extracted and presented as a sequential series of data blocks 177 arranged according to date and time. In the example shown in FIG. 21, the data blocks 177 correspond to parameter data extracted from sensor logs 53. In other examples, the data blocks 177 may correspond to message objects 54, maintenance task objects 55 and/or fault objects 56, depending on the criterion 137, 139 which triggered the alert message object 54. Data blocks 177$b$ relevant to triggering the associated criterion 137, 139 are highlighted. By default, the timeline pane 176 shows at least a period corresponding to the associated criterion 137, 139. The user may expand or translate the timeline to show earlier or later times using respective "Earlier" and "Later" buttons 178, 179.

The user may select any one of the data blocks 177, 177$b$ as a selected data block 180. The selected data block 180 is indicated in the third GUI 170 by a visual indicator 181, and data corresponding to the selected data block 180 is displayed in a data block review pane 182.

In the example shown in FIG. 21, the selected alert message object 54 is associated with a statistical criterion 137 and data blocks 177, 177$b$ correspond to parameter data extracted from sensor logs 53. The data block review pane 182 displays data from a sensor 19, in the form of axes on which a parameter curve 183 is plotted. An average value 184 determined from historical data and one or more threshold values 185 are also shown. In the example shown in FIG. 21, the threshold values 185 correspond to $\pm 3\sigma$, where a is a standard deviation determined from historical data and the average value 184. Regions 186 where the parameter curve 183 exceeds the threshold 185 are highlighted for visual emphasis.

In general, a sub-system 18 may include multiple sensors 19 forming a sensor group 20. A sensor group 20 may include two or more sensors 19 which measure the same parameter as two or more locations within the sub-system 18. When a data block 177, 177$b$ is selected, the data block review pane 182 will initially show a parameter curve 183 corresponding to a sensor 19 which was exceeded the relevant threshold 185. The user may explore the problem by select other sensors 19 belonging to the same sensor group 20 using a drop down control 187 of the data block review pane 182, then display a parameter curve 183 corresponding to the newly selected sensor 19 using an "Update" button 188.

In this way, an engineer or mechanic can use the second GUI 143 to obtain an at-a-glance overview of the alert message objects 54 generated for one or more ships 15*a*. The engineer or mechanic may then use the third GUI 170 drill down to the specific information from the sensor logs 53 and machine readable logs 16, 17, 21. A complex machine 15, for example a ship 15*a*, may generate more raw data than an engineer, or even a large team of engineers could possible analyse. The second and third GUI 143, 170 cooperate with a system 100 for preventing faults to highlight the relevant technical data to an engineer or mechanic. Even though the engineer or mechanic may make a decision about what preventative maintenance to perform, the second and third GUI 143, 170 allow them to make such a decision using technical data which they would otherwise not be able to locate and/or analyse within a reasonable timeframe.

Alternatively, if the data block 177, 177*b* was a message object 54, the data block review pane 182 may display message contents. If the data block 177, 177*b* was a maintenance task object 55, the data block review pane 182 may display details such as a maintenance task type (task ID), free text notes made by an engineer or mechanic, and so forth. If the data block 177, 177*b* was a fault object 56, the data block review pane 182 may display fault data 57 and, if available, fault resolution data 58.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicant hereby gives notice that new claims may be formulated to such features and/or combinations of such features during the prosecution of the present application or of any further application derived therefrom.

The invention claimed is:

1. A computer-implemented method of determining a fault probability for a first machine, wherein the method is performed using one or more processors or special-purpose computing hardware, the method comprising:
   accessing a plurality of sensor logs corresponding to a first machine, each sensor log spanning at least a first period;
   accessing first computer readable logs corresponding to the first machine, each computer readable log spanning at least the first period, the computer readable logs comprising a maintenance log comprising a plurality of maintenance task objects, each maintenance task object comprising a time and a maintenance task type;
   determining a set of statistical metrics derived from the sensor logs;
   determining a set of log metrics derived from the computer readable logs; and
   determining, using a risk model that receives the statistical metrics and log metrics as inputs, one or more risk scores, each of the one or more risk scores indicative of one or more fault probabilities and one or more fault severities of one or more fault types occurring in the first machine within a second period, the one or more risk scores facilitating a subsequent controlling of the first machine prior to the second period.

2. The method according to claim 1, wherein the computer readable logs for each machine further comprise a message log including a plurality of message objects, each message object comprising a time and a message type.

3. The method according to claim 1, wherein the computer readable logs for each machine further comprise a fault log including a plurality of fault objects, each fault object comprising a time, a duration and a fault type.

4. The method according to claim 1, wherein the risk model is a machine learning model configured to:
   receive the statistical metrics and log metrics as inputs; and
   output fault probabilities corresponding to one or more fault types occurring in the first machine within a second period.

5. The method according to claim 1, wherein the risk model is a weighted average model comprising:
   one or more fault criteria groups, each fault criteria group corresponding to a fault type, each fault criteria group comprising:
   a plurality of statistical criteria and/or a plurality of log criteria;
   a set of weighting values, each weighting value corresponding to a statistical criterion or a log criterion;
   wherein determining risk scores comprises, for each fault criteria group:
   determining, based on the statistical metrics, whether one or more statistical criteria are satisfied;
   determining, based on the log criteria, whether one or more log criteria are satisfied;
   in dependence upon at least one statistical criterion or at least one log criterion are satisfied, calculating a risk score for the fault criteria group by summing the weighting values corresponding to each satisfied criterion.

6. The method according to claim 5, wherein each weighting value is a fault probability value and each risk score takes the form of an overall probability of the corresponding fault type.

7. The method according to claim 5, wherein each weighting value is an importance metric.

8. The method according to claim 1, the method further comprising:
   accessing a plurality of second computer readable logs corresponding to one or more second machines which are the same as the first machine, the computer readable logs for each second machine comprising:
   a maintenance log comprising a plurality of maintenance task objects, each maintenance task object comprising a time and a maintenance task type; and
   a fault log comprising a plurality of fault objects, each fault object comprising a time, a duration and a fault type;
   determining a fault metric for each fault type based on the fault probabilities;
   determining a priority fault type based on the fault metric;
   analysing the maintenance logs and fault logs belonging to the plurality of second computer readable logs to correlate the priority fault type with a priority maintenance task; and
   outputting the priority maintenance task.

9. The method according to claim 8, wherein the fault metric for each fault type is a product of a fault probability for that fault type and an average duration for that fault type determined based on the second computer readable logs.

10. The method according to claim 8, further comprising:
determining, based on the priority maintenance task type, a change in the probabilities for each fault type which would result if the priority maintenance task was subsequently performed.

11. The method according to claim 1, wherein one or more sensor logs are processed using a dynamic time-warping technique to obtain corresponding warped sensor logs, and wherein one or more statistical metrics are determined from the warped sensor logs.

12. A non-transitory computer-readable storage medium including instructions that, when executed by at least one processor of a computing system, cause the computing system to perform a method comprising:
accessing a plurality of sensor logs corresponding to a first machine, each sensor log spanning at least a first period;
accessing first computer readable logs corresponding to the first machine, each computer readable log spanning at least the first period, the computer readable logs comprising a maintenance log comprising a plurality of maintenance task objects, each maintenance task object comprising a time and a maintenance task type;
determining a set of statistical metrics derived from the sensor logs;
determining a set of log metrics derived from the computer readable logs; and
determining, using a risk model that receives the statistical metrics and log metrics as inputs, one or more risk scores, each of the one or more risk scores indicative of one or more fault probabilities and one or more fault severities of one or more fault types occurring in the first machine within a second period, the one or more risk scores facilitating a subsequent controlling of the first machine prior to the second period.

13. A system, the system comprising one or more processors or special-purpose computing hardware configured to:
accessing a plurality of sensor logs corresponding to a first machine, each sensor log spanning at least a first period;
accessing first computer readable logs corresponding to the first machine, each computer readable log spanning at least the first period, the computer readable logs comprising a maintenance log comprising a plurality of maintenance task objects, each maintenance task object comprising a time and a maintenance task type;
determining a set of statistical metrics derived from the sensor logs;
determining a set of log metrics derived from the computer readable logs; and
determining, using a risk model that receives the statistical metrics and log metrics as inputs, one or more risk scores, each of the one or more risk scores indicative of one or more fault probabilities and one or more fault severities of one or more fault types occurring in the first machine within a second period, the one or more risk scores facilitating a subsequent controlling of the first machine prior to the second period.

14. The system according to claim 13, wherein the computer readable logs for each machine further comprise a message log including a plurality of message objects, each message object comprising a time and a message type.

15. The system according to claim 13, wherein the computer readable logs for each machine further comprise a fault log including a plurality of fault objects, each fault object comprising a time, a duration and a fault type.

16. The system according to claim 13, wherein the risk model is a machine learning model configured to:
receive the statistical metrics and log metrics as inputs; and
output fault probabilities corresponding to one or more fault types occurring in the first machine within a second period.

17. The system according to claim 13, wherein the risk model is a weighted average model comprising:
one or more fault criteria groups, each fault criteria group corresponding to a fault type, each fault criteria group comprising:
a plurality of statistical criteria and/or a plurality of log criteria;
a set of weighting values, each weighting value corresponding to a statistical criterion or a log criterion;
wherein determining risk scores comprises, for each fault criteria group:
determining, based on the statistical metrics, whether one or more statistical criteria are satisfied;
determining, based on the log criteria, whether one or more log criteria are satisfied;
in dependence upon at least one statistical criterion or at least one log criterion are satisfied, calculating a risk score for the fault criteria group by summing the weighting values corresponding to each satisfied criterion.

18. The system according to claim 17, wherein each weighting value is a fault probability value and each risk score takes the form of an overall probability of the corresponding fault type.

19. The system according to claim 17, wherein each weighting value is an importance metric.

20. The system according to claim 13, wherein the system is further configured to perform:
accessing a plurality of second computer readable logs corresponding to one or more second machines which are the same as the first machine, the computer readable logs for each second machine comprising:
a maintenance log comprising a plurality of maintenance task objects, each maintenance task object comprising a time and a maintenance task type; and
a fault log comprising a plurality of fault objects, each fault object comprising a time, a duration and a fault type;
determining a fault metric for each fault type based on the fault probabilities;
determining a priority fault type based on the fault metric;
analysing the maintenance logs and fault logs belonging to the plurality of second computer readable logs to correlate the priority fault type with a priority maintenance task; and
outputting the priority maintenance task.

* * * * *